(12) United States Patent  (10) Patent No.: US 9,105,608 B2
Yamazaki  (45) Date of Patent: *Aug. 11, 2015

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/646,070

(22) Filed: Oct. 5, 2012

(65) Prior Publication Data

US 2013/0087790 A1  Apr. 11, 2013

(30) Foreign Application Priority Data

Oct. 7, 2011 (JP) ................................. 2011-223013

(51) Int. Cl.
    *H01L 31/00* (2006.01)
    *H01L 29/423* (2006.01)
    *H01L 29/49* (2006.01)
    *H01L 29/786* (2006.01)

(52) U.S. Cl.
    CPC ...... *H01L 29/42384* (2013.01); *H01L 29/4908* (2013.01); *H01L 29/7869* (2013.01)

(58) Field of Classification Search
    USPC ................................ 257/43, 57; 438/151, 596
    See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Cheung Lee
*Assistant Examiner* — Frederick B Hargrove
(74) *Attorney, Agent, or Firm* — Eric J. Robinson; Robinson Intellectual Property Law Office, P.C.

(57) ABSTRACT

A miniaturized transistor having favorable electric characteristics is provided. The transistor includes an oxide semiconductor layer which is in contact with a source electrode layer on one of side surfaces in a channel length direction and in contact with a drain electrode layer on the other of the side surfaces in the channel length direction. With this structure, an electric field between the source electrode layer and the drain electrode layer is relaxed and a short-channel effect is suppressed. Further, a sidewall layer having conductivity is provided on a side surface of a gate electrode layer in the channel length direction, so that the sidewall layer having conductivity overlaps with the source electrode layer or the drain electrode layer with a gate insulating layer provided therebetween, which enables the transistor to substantially have an $L_{ov}$ region.

14 Claims, 13 Drawing Sheets

(56) References Cited

U.S. PATENT DOCUMENTS

| | | | |
|---|---|---|---|
| 5,851,861 A * | 12/1998 | Suzawa et al. | 438/166 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,391,087 B2 | 6/2008 | Murthy et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 8,237,166 B2 | 8/2012 | Kumomi et al. | |
| 8,314,420 B2 | 11/2012 | Hoffman et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 * | 8/2007 | Hirao et al. | 257/43 |
| 2007/0187760 A1 | 8/2007 | Furuta et al. | |
| 2007/0194379 A1 | 8/2007 | Hosono et al. | |
| 2007/0212842 A1 * | 9/2007 | Maekawa | 438/305 |
| 2007/0252928 A1 | 11/2007 | Ito et al. | |
| 2007/0272922 A1 * | 11/2007 | Kim et al. | 257/43 |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0140053 A1 * | 6/2009 | Yamazaki et al. | 235/492 |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0051940 A1 * | 3/2010 | Yamazaki et al. | 257/43 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0187524 A1 | 7/2010 | Isobe et al. | |
| 2010/0276688 A1 | 11/2010 | Yano et al. | |
| 2010/0295041 A1 | 11/2010 | Kumomi et al. | |
| 2011/0089414 A1 | 4/2011 | Yamazaki et al. | |
| 2011/0133177 A1 | 6/2011 | Suzawa et al. | |
| 2011/0193080 A1 | 8/2011 | Yamazaki et al. | |
| 2011/0210326 A1 | 9/2011 | Suzawa et al. | |
| 2012/0086000 A1 | 4/2012 | Mizoguchi et al. | |
| 2012/0094433 A1 | 4/2012 | Mizoguchi et al. | |
| 2012/0126224 A1 | 5/2012 | Arai | |
| 2012/0161121 A1 | 6/2012 | Yamazaki | |
| 2012/0161124 A1 | 6/2012 | Yamazaki | |
| 2012/0161125 A1 | 6/2012 | Yamazaki | |
| 2012/0161126 A1 | 6/2012 | Yamazaki | |
| 2012/0178224 A1 | 7/2012 | Yamazaki | |
| 2012/0187396 A1 | 7/2012 | Yamazaki et al. | |
| 2012/0187397 A1 | 7/2012 | Yamazaki et al. | |
| 2012/0225520 A1 * | 9/2012 | Suzawa et al. | 438/104 |
| 2013/0087782 A1 * | 4/2013 | Yamazaki et al. | 257/43 |
| 2013/0092928 A1 * | 4/2013 | Yamazaki | 257/43 |
| 2013/0092940 A1 | 4/2013 | Tezuka et al. | |
| 2013/0092943 A1 | 4/2013 | Hatano et al. | |

FOREIGN PATENT DOCUMENTS

| | | |
|---|---|---|
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

(56) References Cited

OTHER PUBLICATIONS

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

(56) References Cited

OTHER PUBLICATIONS

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122101-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the semiconductor device.

In this specification and the like, a semiconductor device refers to all types of devices which can function by utilizing semiconductor characteristics; an electro-optical device, a light-emitting display device, a semiconductor circuit, and an electronic device are all semiconductor devices.

2. Description of the Related Art

A technique by which a transistor is formed using a semiconductor thin film formed over a substrate having an insulating surface has been attracting attention. The transistor is applied to a wide range of semiconductor electronic devices such as an integrated circuit (IC) and an image display device (also simply referred to as a display device). A silicon-based semiconductor material is widely known as a material for a semiconductor thin film applicable to the transistor. As another material, an oxide semiconductor has been attracting attention.

For example, Patent Document 1 and Patent Document 2 disclose a technique by which a transistor is manufactured using zinc oxide or an In—Ga—Zn-based oxide as an oxide semiconductor and is used as a switching element or the like in a pixel of a display device.

REFERENCE

Patent Document

[Patent Document 1] Japanese Published Patent Application No. 2007-123861
[Patent Document 2] Japanese Published Patent Application No. 2007-096055

SUMMARY OF THE INVENTION

In order to achieve high-speed operation, low power consumption, high integration, or the like of a transistor, it is necessary to miniaturize a transistor.

In the case where a transistor is miniaturized, a problem of a short-channel effect is caused. The short-channel effect refers to a phenomenon in which electric characteristics of a transistor are degraded, which becomes more apparent as the transistor is miniaturized (a channel length (L) is reduced). The short-channel effect occurs when a drain electric field reaches a source. Specific examples of the short-channel effect include a decrease in threshold voltage, an increase in subthreshold swing (S value), an increase in leakage current, and the like.

In addition, it is desirable to improve the on-state characteristics (e.g., on-state current and field-effect mobility) of the miniaturized transistor for high-speed response and high-speed driving of a semiconductor device. To suppress a decrease in on-state current of a transistor, it is effective to provide a gate electrode layer in a region (hereinafter, also referred to as an $L_{ov}$ region in this specification) where the gate electrode layer overlaps with a source electrode layer or a drain electrode layer with a gate insulating layer provided therebetween. However, formation of the $L_{ov}$ region requires precise alignment between an oxide semiconductor layer having a small line width and the gate electrode layer having a small line width, requiring even higher precision as the transistor is miniaturized.

Therefore, an object of one embodiment of the present invention is to provide a semiconductor device which is miniaturized with favorable characteristics maintained. For example, it is an object of one embodiment of the present invention to provide a semiconductor device in which a short-channel effect is suppressed and miniaturization is achieved. It is another object of one embodiment of the present invention to provide a semiconductor device in which a decrease in on-state current is suppressed and miniaturization is achieved.

In one embodiment of the disclosed invention, a source electrode layer which is in contact with one of side surfaces of an oxide semiconductor layer in a channel length direction and a drain electrode layer which is in contact with the other of the side surfaces are formed, and a sidewall layer including a conductive material is formed over the source electrode layer or the drain electrode layer with a gate insulating layer provided therebetween. Specifically, any of the following structures can be employed, for example.

One embodiment of the present invention is a semiconductor device including a source electrode layer; a drain electrode layer; an oxide semiconductor layer in contact with the source electrode layer on one of side surfaces in a channel length direction and in contact with the drain electrode layer on the other of the side surfaces in the channel length direction; a gate insulating layer in contact with an entire upper surface of the oxide semiconductor layer, at least a part of an upper surface of the source electrode layer, and at least an upper part of a surface of the drain electrode layer; a gate electrode layer over the oxide semiconductor layer with the gate insulating layer provided therebetween; a first sidewall layer in contact with one of side surfaces of the gate electrode layer in the channel length direction; and a second sidewall layer in contact with the other of the side surfaces of the gate electrode layer in the channel length direction. At least part of the first sidewall layer is provided over the source electrode layer with the gate insulating layer provided therebetween, and at least part of the second sidewall layer is provided over the drain electrode layer with the gate insulating layer provided therebetween. The first sidewall layer and the second sidewall layer have conductivity.

One embodiment of the present invention is a semiconductor device including a source electrode layer; a drain electrode layer; an oxide semiconductor layer including a first impurity region, a second impurity region, and a channel formation region sandwiched between the first impurity region and the second impurity region and being in contact with the source electrode layer on a side surface of the first impurity region in a channel length direction and in contact with the drain electrode layer on a side surface of the second impurity region in the channel length direction; a gate insulating layer in contact with an entire upper surface of the oxide semiconductor layer, at least a part of an upper surface of the source electrode layer, and at least a part of an upper surface of the drain electrode layer; a gate electrode layer over the channel formation region with the gate insulating layer provided therebetween; a first sidewall layer in contact with one of side surfaces of the gate electrode layer in the channel length direction; and a second sidewall layer in contact with the other of the side surfaces of the gate electrode layer in the channel length direction. At least part of the first sidewall layer is provided over the source electrode layer with the gate insulating layer provided therebetween, and at least part of the second sidewall layer is provided over the drain electrode layer with the gate insulating layer provided therebetween. The first sidewall layer and the second sidewall layer have conductivity.

In the above semiconductor device, a side surface of the oxide semiconductor layer in contact with the source electrode layer or the drain electrode layer may have a tapered shape.

Further, the above semiconductor device may further include an insulating layer provided over the first sidewall layer, the second sidewall layer, and the gate electrode layer; a first wiring layer electrically connected to the source electrode layer through a first opening provided in the insulating layer and the gate insulating layer; and a second wiring layer electrically connected to the drain electrode layer through a second opening provided in the insulating layer and the gate insulating layer.

Another embodiment of the present invention is a method for manufacturing a semiconductor device, including the steps of forming an island-shaped oxide semiconductor layer; forming a conductive film covering the oxide semiconductor layer; removing a region of the conductive film which overlaps with the oxide semiconductor layer with a chemical mechanical polishing method to provide a conductive film having an opening; processing the conductive film having the opening to form a source electrode layer and a drain electrode layer; forming a gate insulating layer over the oxide semiconductor layer, the source electrode layer, and the drain electrode layer; forming a gate electrode layer over the oxide semiconductor layer with the gate insulating layer provided therebetween; and forming a first sidewall layer or a second sidewall layer having conductivity in a region in contact with a side surface of the gate electrode layer and overlapping with the source electrode layer or the drain electrode layer.

Note that the oxide semiconductor is in a single crystal state, a polycrystalline (also referred to as polycrystal) state, an amorphous state, or the like.

In the case of an oxide semiconductor in an amorphous state, a flat surface can be obtained with relative ease, so that interface scattering of carriers (electrons) in a transistor including such an oxide semiconductor at the time of operation can be reduced, and relatively high field-effect mobility can be obtained with relative ease.

In an oxide semiconductor having crystallinity, defects in the bulk can be further reduced and when the surface flatness of the oxide semiconductor is improved, field-effect mobility of a transistor including the oxide semiconductor having crystallinity can be higher than that of a transistor including an oxide semiconductor in an amorphous state. In order to improve the surface flatness, the oxide semiconductor is preferably formed over a flat surface. Specifically, the oxide semiconductor is formed over a surface with the average surface roughness ($R_a$) of less than or equal to 0.15 nm, preferably less than or equal to 0.1 nm.

Note that the average surface roughness ($R_a$) is obtained by expanding, into three dimensions, arithmetic mean surface roughness that is defined by JIS B 0601:2001 (ISO4287: 1997) so as to be able to apply it to a curved surface. $R_a$ can be expressed as an "average value of the absolute values of deviations from a reference surface to a specific surface" and is defined by the following formula.

$$Ra = \frac{1}{S_0} \int_{y_1}^{y_2} \int_{x_1}^{x_2} |f(x, y) - Z_0| dx dy \quad \text{[FORMULA 1]}$$

Here, the specific surface is a surface which is a target of roughness measurement, and is a quadrilateral region which is specified by four points represented by the coordinates ($x_1$, $y_1$, $f(x_1, y_1)$), ($x_1$, $y_2$, $f(x_1, y_2)$), ($x_2$, $y_1$, $f(x_2, y_1)$), and ($x_2$, $y_2$, $f(x_2, y_2)$). Moreover, $S_0$ represents the area of a rectangle which is obtained by projecting the specific surface on the xy plane, and $Z_0$ represents the height of the reference surface (the average height of the specific surface). $R_a$ can be measured using an atomic force microscope (AFM).

The semiconductor device according to one embodiment of the present invention includes the oxide semiconductor layer that is in contact with the source electrode layer on one of the side surfaces in the channel length direction and in contact with the drain electrode layer on the other of the side surfaces in the channel length direction. This structure enables a region where the oxide semiconductor layer is in contact with the source electrode layer or the drain electrode layer to have high resistance as compared with the case where the oxide semiconductor layer is in contact with the source electrode layer or the drain electrode layer on the side surface in the channel length direction and the upper surface (or lower surface), thus achieving relaxation of an electric field between the source electrode layer and the drain electrode layer. Consequently, a short-channel effect due to miniaturization of the transistor can be suppressed.

In the semiconductor device according to one embodiment of the present invention, the sidewall layer having conductivity is provided on the side surface of the gate electrode layer in the channel length direction. Thus, the sidewall layer having conductivity overlaps with the source electrode layer or the drain electrode layer with the gate insulating layer provided therebetween, which enables the transistor to substantially have an $L_{ov}$ region, leading to suppression of a decrease in on-state current of the transistor.

Accordingly, one embodiment of the present invention can provide a semiconductor device which is miniaturized with favorable characteristics maintained.

DETAILED DESCRIPTION OF THE INVENTION

Figure 1A:
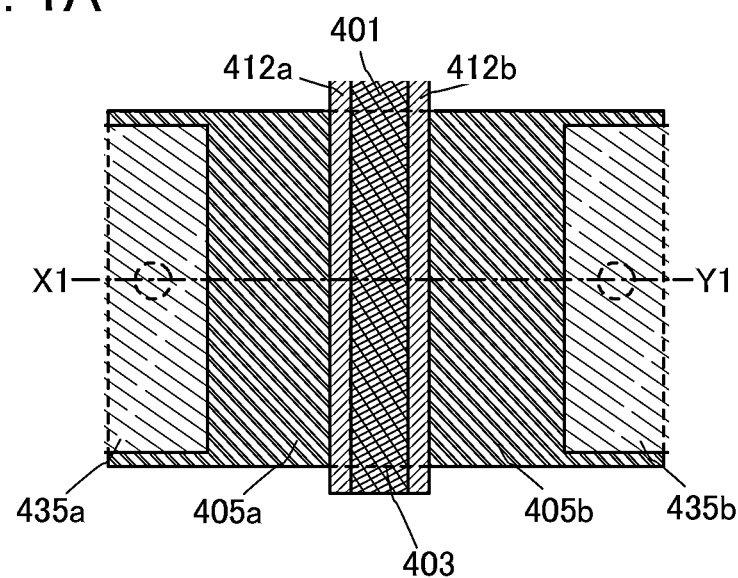
FIGS. 1A and 1B are a plan view and a cross-sectional view illustrating one embodiment of a semiconductor device.

Examples of embodiments of the present invention will be described below with reference to the drawings. Note that the present invention is not limited to the following description, and it will be easily understood by those skilled in the art that various changes and modifications can be made without departing from the spirit and scope of the present invention. Therefore, the present invention should not be construed as being limited to the following description of the embodiments.

Note that in structures of the present invention described below, the same portions or portions having similar functions are denoted by the same reference numerals in different drawings, and description thereof is not repeated. Further, the same hatching pattern is applied to portions having similar functions, and the portions are not especially denoted by reference numerals in some cases.

Note that the ordinal numbers such as "first" and "second" in this specification and the like are used for convenience and do not denote the order of steps or the stacking order of layers. In addition, the ordinal numbers in this specification and the like do not denote particular names which specify the present invention.

Embodiment 1

In this embodiment, one embodiment of semiconductor devices and a method for manufacturing the semiconductor device will be described with reference to FIGS. 1A and 1B, FIGS. 2A and 2B, FIGS. 3A to 3D, and FIGS. 4A to 4C.

<Example of Structure of Semiconductor Device>

Figure 1B:
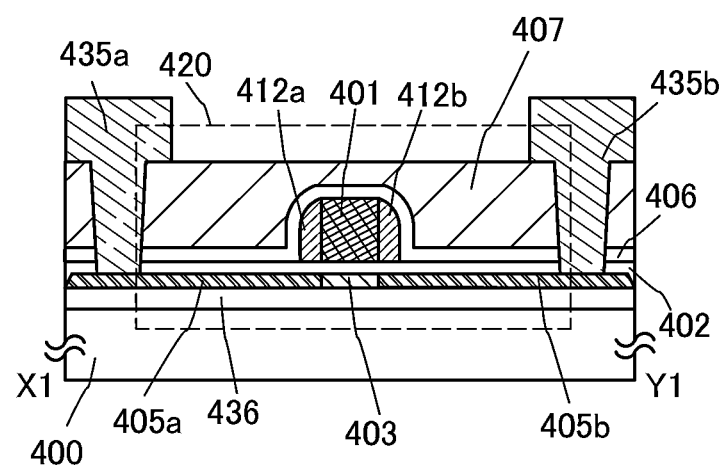

As an example of a semiconductor device, a plan view and a cross-sectional view of a transistor 420 are illustrated in FIGS. 1A and 1B. FIG. 1A is a plan view of the transistor 420, and FIG. 1B is a cross-sectional view taken along line X1-Y1 in FIG. 1A. Note that in FIG. 1A, some components of the transistor 420 (e.g., an insulating layer 407) are not illustrated for simplicity.

The transistor 420 in FIGS. 1A and 1B includes, over a substrate 400 having an insulating surface, a base insulating layer 436; a source electrode layer 405a; a drain electrode layer 405b; an oxide semiconductor layer 403 in contact with the source electrode layer 405a on one of side surfaces in a channel length direction and in contact with the drain electrode layer 405b on the other of the side surfaces in the channel length direction; a gate insulating layer 402 in contact with an entire upper surface of the oxide semiconductor layer 403, at least a part of an upper surface of the source electrode layer 405a, and at least a part of an upper surface of the drain electrode layer 405b; a gate electrode layer 401 over the oxide semiconductor layer 403 with the gate insulating layer 402 provided therebetween; a sidewall layer 412a in contact with one of side surfaces of the gate electrode layer 401 in the channel length direction; and a sidewall layer 412b in contact with the other of the side surfaces of the gate electrode layer 401 in the channel length direction.

In the transistor 420, at least part of the sidewall layer 412a is provided over the source electrode layer 405a with the gate insulating layer 402 provided therebetween. In other words, at least part of the sidewall layer 412a overlaps with the source electrode layer 405a. Further, at least part of the sidewall layer 412b is provided over the drain electrode layer 405b with the gate insulating layer 402 provided therebetween. In other words, at least part of the sidewall layer 412b overlaps with the drain electrode layer 405b. The sidewall layer 412a and the sidewall layer 412b are formed using a semiconductor material or a conductive material and thus have conductivity. Thus, the sidewall layer 412a and the sidewall layer 412b can serve as part of the gate electrode layer 401; therefore, a region overlapping with the source electrode layer 405a or the drain electrode layer 405b with the gate insulating layer 402 provided therebetween can substantially serve as an $L_{ov}$ region.

Further, the transistor 420 in FIGS. 1A and 1B may include an insulating layer 406 and an insulating layer 407 over the sidewall layer 412a, the sidewall layer 412b, and the gate electrode layer 401 and a wiring layer 435a and a wiring layer 435b over the insulating layer 407 as components. The wiring layer 435a is electrically connected to the source electrode layer 405a through an opening provided in the insulating layer 406, the insulating layer 407, and the gate insulating layer 402, and the wiring layer 435b is electrically connected to the drain electrode layer 405b through an opening provided in the insulating layer 406, the insulating layer 407, and the gate insulating layer 402.

Since the oxide semiconductor layer 403 included in the transistor 420 is in contact with the source electrode layer 405a and the drain electrode layer 405b on the side surfaces in the channel length direction, the contact area with the source electrode layer 405a or the drain electrode layer 405b can be significantly small as compared with the case where the oxide semiconductor layer is in contact with the source electrode layer and the drain electrode layer on the side surfaces and the upper surface (or lower surface). By reducing the contact area between the oxide semiconductor layer 403 and the source electrode layer 405a or the drain electrode layer 405b in such a manner, contact resistance at a contact interface can be increased and an electric field between the source electrode layer and the drain electrode layer can be relaxed. Accordingly, even if the channel length (L) of the transistor 420 is shortened, a short-channel effect can be suppressed.

In the case where a sidewall layer having conductivity is not provided in the transistor 420, precise alignment between an oxide semiconductor layer with a narrow line width and a gate electrode layer with a narrow line width is required for formation of an $L_{ov}$ region, and the required accuracy thereof is increased due to miniaturization of the transistor. However, in the transistor 420 described in this embodiment, the sidewall layer 412a and the sidewall layer 412b which have conductivity are provided on the side surfaces of the gate electrode layer 401 in the channel length direction; therefore, a region where the sidewall layer 412a and the source electrode layer 405a overlap with each other and a region where the sidewall layer 412b and the drain electrode layer 405b overlap with each other can substantially serve as $L_{ov}$ regions. Thus, the degree of freedom in alignment in the formation of the gate electrode layer 401 can be improved, and the transistor 420 in which a decrease in on-state current is suppressed can be provided with a high yield.

The oxide semiconductor layer 403 is preferably a CAAC-OS (c-axis aligned crystalline oxide semiconductor) film.

The CAAC-OS film is not completely single crystal nor completely amorphous. The CAAC-OS film is an oxide semiconductor layer with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of an a-axis and a b-axis of one crystal part may be different from those of another crystal part. In this specification and the like, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor layer, the proportion of crystal parts in the vicinity of the surface of the oxide semiconductor layer is higher than that in the vicinity of the surface where the oxide semiconductor layer is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With the use of the CAAC-OS film in a transistor, change in electric characteristics of the transistor due to irradiation with visible light or ultraviolet light can be suppressed. Thus, the transistor has high reliability.

Figure 2A:
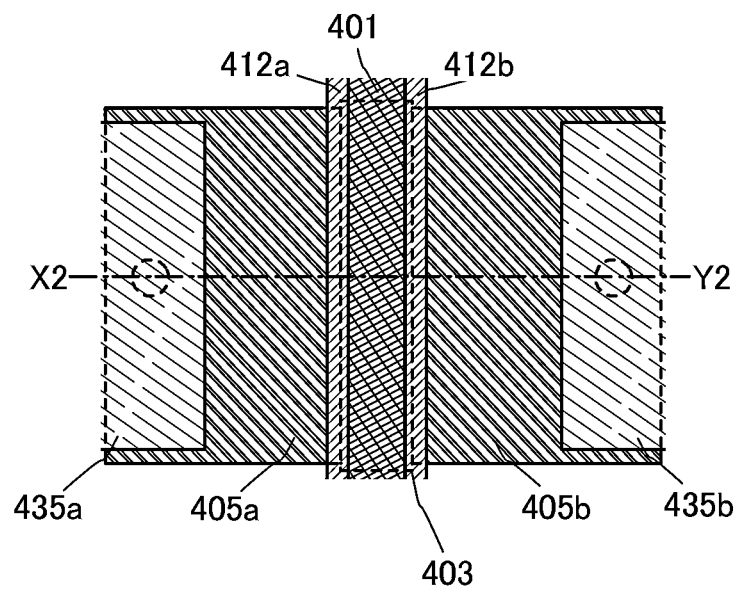
FIGS. 2A and 2B are a plan view and a cross-sectional view illustrating one embodiment of a semiconductor device.
Figure 2B:
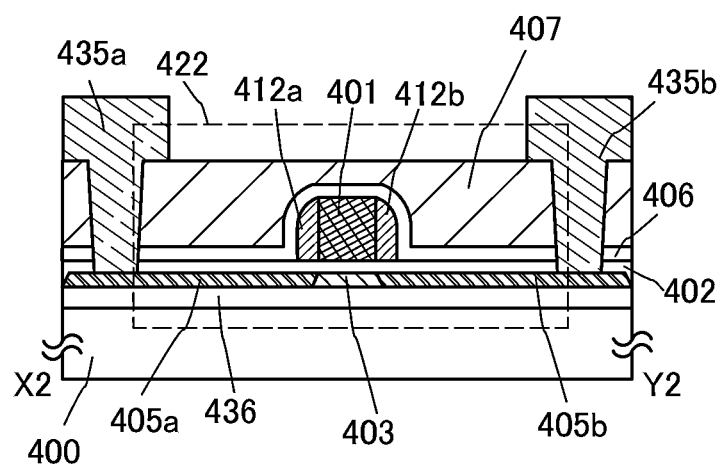

FIGS. 2A and 2B are a plan view and a cross-sectional view illustrating a transistor 422 having a different structure from the transistor 420 illustrated in FIGS. 1A and 1B. FIG. 2A is a plan view of the transistor 422, and FIG. 2B is a cross-sectional view taken along line X2-Y2 in FIG. 2A. Note that in FIG. 2A, some components of the transistor 422 (e.g., the insulating layer 407) are not illustrated for simplicity.

The difference between the transistor 422 in FIGS. 2A and 2B and the transistor 420 in FIGS. 1A and 1B is the shape of the side surface of the oxide semiconductor layer 403. In the transistor 422 in FIGS. 2A and 2B, the side surface of the oxide semiconductor layer 403 in contact with the source electrode layer 405a or the drain electrode layer 405b is tapered. The taper angle can be, for example, greater than or equal to 20° and less than or equal to 50°. Here, the taper angle refers to a tilt angle formed by the side surface and a bottom surface of the oxide semiconductor layer 403 when the oxide semiconductor layer is observed in a direction perpendicular to its cross section.

The tapered side surface of the oxide semiconductor layer 403 enables a conductive film which is to be the source electrode layer 405a and the drain electrode layer 405b to be formed with good coverage. Further, since the oxide semiconductor layer 403 has a tapered end portion, generation of oxygen vacancies due to elimination of oxygen from the side surface of the oxide semiconductor layer is suppressed, and thus leakage current of the transistor 422 can be reduced.

Resistance is inversely proportional to a cross-sectional area; the resistance of the oxide semiconductor layer 403 having a tapered shape is gradually increased toward the end portion. Thus, the electric field between the source electrode layer 405a and the drain electrode layer 405b can be further relaxed.

<Example of Manufacturing Process of Transistor>

An example of a manufacturing process of a transistor according to this embodiment will be described below with reference to FIGS. 3A to 3D and FIGS. 4A to 4C. Note that described below as an example is a manufacturing process of the transistor 422.

First, the base insulating layer 436 is formed over the substrate 400 having an insulating surface.

There is no particular limitation on a substrate that can be used as the substrate 400 having an insulating surface as long as it has at least heat resistance to withstand heat treatment process performed later. For example, a glass substrate of barium borosilicate glass, aluminoborosilicate glass, or the like, a ceramic substrate, a quartz substrate, or a sapphire substrate can be used. Alternatively, the substrate 400 may be a single crystal semiconductor substrate or a polycrystalline semiconductor substrate of silicon, silicon carbide, or the like; a compound semiconductor substrate of silicon germanium or the like; an SOI substrate; or any of these substrates over which a semiconductor element is provided.

A semiconductor device may be manufactured using a flexible substrate as the substrate 400. To manufacture a flexible semiconductor device, the transistor 422 including the oxide semiconductor layer 403 may be directly formed over a flexible substrate; or alternatively, the transistor 422 including the oxide semiconductor layer 403 may be formed over a substrate, and then may be separated and transferred to a flexible substrate. Note that in order to separate the transistor from the formation substrate and transfer it to the flexible substrate, a separation layer is preferably provided between the formation substrate and the transistor 422 including the oxide semiconductor layer.

The base insulating layer 436 can have a single-layer structure or a stacked-layer structure including one or more films selected from those containing silicon oxide, silicon nitride, silicon oxynitride, silicon nitride oxide, aluminum oxide, aluminum nitride, aluminum oxynitride, aluminum nitride oxide, hafnium oxide, gallium oxide, and a mixed material of any of these materials. Note that the base insulating layer 436 preferably has a single-layer structure or a stacked-layer structure including an oxide insulating film so that the oxide insulating film is in contact with the oxide semiconductor layer 403 to be formed later. Note that the base insulating layer 436 is not necessarily provided.

The base insulating layer 436 preferably includes a region containing oxygen the proportion of which is higher than the stoichiometric proportion (hereinafter, also referred to as an oxygen-excess region), in which case oxygen vacancies in the oxide semiconductor layer 403 to be formed later can be filled with the excess oxygen contained in the base insulating layer 436. In the case of having a stacked-layer structure, the base insulating layer 436 preferably includes an oxygen-excess region at least in a layer in contact with the oxide semiconductor layer 403. In order to provide the oxygen-excess region in the base insulating layer 436, for example, the base insulating layer 436 may be formed in an oxygen atmosphere. Alternatively, the oxygen-excess region may be formed by introducing oxygen (including at least one of an oxygen radical, an oxygen atom, and an oxygen ion) into the base insulating layer 436 after its formation. Oxygen can be introduced by an ion implantation method, an ion doping method, a plasma immersion ion implantation method, plasma treatment, or the like.

Figure 3A:
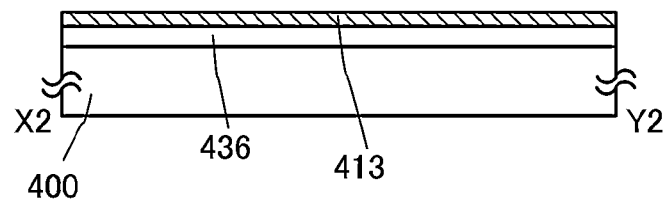
FIGS. 3A to 3D illustrate an example of a method for manufacturing the semiconductor device.

Next, an oxide semiconductor layer 413 is formed over the base insulating layer 436 (see FIG. 3A). The thickness of the oxide semiconductor layer 413 is, for example, 3 nm to 30 nm, preferably 5 nm to 20 nm.

The oxide semiconductor layer 413 may have either a single-layer structure or a stacked-layer structure. In addition, the oxide semiconductor layer 413 may have an amorphous structure or include a crystal part. In the case where the oxide semiconductor layer 413 has an amorphous structure, heat treatment may be performed on the oxide semiconductor layer in a later manufacturing step so that the oxide semiconductor layer has crystallinity. The heat treatment for crystallizing the amorphous oxide semiconductor layer is performed at a temperature higher than or equal to 250° C. and lower than or equal to 700° C., preferably higher than or equal to 400° C., further preferably higher than or equal to 500° C., still further preferably higher than or equal to 550° C. Note that the heat treatment can also serve as another heat treatment in the manufacturing process.

The oxide semiconductor layer 413 can be formed by a sputtering method, a molecular beam epitaxy (MBE) method, a CVD method, a pulsed laser deposition method, an atomic layer deposition (ALD) method, or the like as appropriate. The oxide semiconductor layer 413 may be formed using a sputtering apparatus which performs deposition with surfaces of a plurality of substrates set substantially perpendicular to a surface of a sputtering target.

In the formation of the oxide semiconductor layer 413, the hydrogen concentration in the oxide semiconductor layer 413 is preferably reduced as much as possible. In order to reduce the hydrogen concentration, for example, in the case where the oxide semiconductor layer is formed by a sputtering method, a high-purity rare gas (typically argon), high-purity oxygen, or a high-purity mixed gas of a rare gas and oxygen, from which impurities such as hydrogen, water, a hydroxyl group, and hydride have been removed, is used as appropriate as an atmosphere gas supplied to a process chamber of a sputtering apparatus.

The oxide semiconductor layer 413 is formed in such a manner that a sputtering gas from which hydrogen and moisture have been removed is introduced into the deposition chamber while moisture remaining therein is removed, whereby the hydrogen concentration in the formed oxide semiconductor layer 413 can be reduced. In order to remove moisture remaining in the deposition chamber, an entrapment vacuum pump such as a cryopump, an ion pump, or a titanium sublimation pump is preferably used. A turbo molecular pump provided with a cold trap may be used. When the deposition chamber is evacuated with the cryopump, which has a high capability in removing a hydrogen molecule, a compound containing a hydrogen atom such as water ($H_2O$) (more preferably, also a compound containing a carbon atom), and the like, the impurity concentration in the oxide semiconductor layer 413 formed in the deposition chamber can be reduced.

Further, in the case where the oxide semiconductor layer 413 is formed by a sputtering method, the relative density (the fill rate) of the metal oxide target which is used for forming the oxide semiconductor layer 413 is greater than or equal to 90% and less than or equal to 100%, preferably greater than or equal to 95% and less than or equal to 99.9%. With the use of a metal oxide target with a high relative density, the formed oxide semiconductor layer 413 can have high density.

In order to reduce the impurity concentration in the oxide semiconductor layer 413, it is also effective to form the oxide semiconductor layer 413 while the substrate 400 is kept at high temperature. The temperature at which the substrate 400 is heated may be higher than or equal to 150° C. and lower than or equal to 450° C.; the substrate temperature is preferably higher than or equal to 200° C. and lower than or equal to 350° C. By heating the substrate at high temperature during the film formation, a crystalline oxide semiconductor layer can be formed.

An oxide semiconductor used for the oxide semiconductor layer 413 preferably contains at least indium (In) or zinc (Zn). In particular, both In and Zn are preferably contained. As a stabilizer for reducing a variation in electric characteristics among transistors including the oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main components and there is no particular limitation on the ratio of In, Ga, and Zn. The In—Ga—Zn-based oxide may contain a metal element other than the In, Ga, and Zn.

A material represented by $InMO_3(ZnO)_m$ (m>0, where m is not an integer) may be used as the oxide semiconductor. Note that M represents one or more metal elements selected from Ga, Fe, Mn, and Co. Alternatively, a material represented by $In_2SnO_5(ZnO)_n$ (n>0, where n is an integer) may be used as the oxide semiconductor.

For example, an In—Ga—Zn-based oxide with an atomic ratio of In:Ga:Zn=1:1:1 (=1/3:1/3:1/3), In:Ga:Zn=2:2:1 (=2/5:2/5:1/5), or In:Ga:Zn=3:1:2 (=1/2:1/6:1/3), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

For example, high mobility can be obtained relatively easily in the case of using an In—Sn—Zn oxide. However, mobility can be increased by reducing the defect density in a bulk also in the case of using an In—Ga—Zn-based oxide.

For example, in the case where the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1), a, b, and c satisfy the following relation: $(a-A)^2+(b-B)^2+(c-C)^2 \le r^2$, and r may be 0.05, for example. The same applies to other oxides.

It is preferable that a high-purity gas from which impurities such as hydrogen, water, a hydroxyl group, and hydride have been removed be used as a sputtering gas used for the formation of the oxide semiconductor layer 413.

There are three methods for obtaining a CAAC-OS film when the CAAC-OS film is used as the oxide semiconductor layer 413. The first method is to form an oxide semiconductor layer at a film formation temperature higher than or equal to 200° C. and lower than or equal to 450° C., thereby obtaining c-axis alignment substantially perpendicular to a surface. The second method is to form a thin oxide semiconductor layer and then subject the layer to heat treatment performed at a temperature higher than or equal to 200° C. and lower than or equal to 700° C., thereby obtaining c-axis alignment substantially perpendicular to a surface. The third method is to form a first thin oxide semiconductor layer, subject the layer to heat treatment performed at a temperature higher than or equal to 200° C. and lower than or equal to 700° C., and then form a second oxide semiconductor layer, thereby obtaining c-axis alignment substantially perpendicular to a surface.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particles reach a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Before the formation of the oxide semiconductor layer 413, planarization treatment may be performed on the surface on which the oxide semiconductor layer 413 is to be formed. As the planarization treatment, polishing treatment (e.g., chemical mechanical polishing), dry-etching treatment, or plasma treatment can be used, though there is no particular limitation on the planarization treatment.

As the plasma treatment, reverse sputtering in which an argon gas is introduced and plasma is generated can be performed. The reverse sputtering is a method in which voltage is applied to a substrate side with the use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface on which the oxide semiconductor layer 413 is to be formed.

As the planarization treatment, polishing treatment, dry etching treatment, or plasma treatment may be performed plural times, or these treatments may be performed in combination. In the case where the treatments are combined, the order of steps may be set as appropriate, without particular limitation, depending on the unevenness of the surface on which the oxide semiconductor layer 413 is to be formed.

Further, the oxide semiconductor layer 413 is preferably subjected to heat treatment for removing excess hydrogen (including water and a hydroxyl group) in the oxide semiconductor layer 413 (dehydration or dehydrogenation). The temperature of the heat treatment is higher than or equal to 300° C. and lower than or equal to 700° C., or lower than the strain point of the substrate. The heat treatment can be performed under reduced pressure, a nitrogen atmosphere, or the like.

Hydrogen, which is an impurity imparting n-type conductivity, can be removed from the oxide semiconductor by the heat treatment. For example, the hydrogen concentration in the oxide semiconductor layer 413 after the dehydration or dehydrogenation treatment can be $5 \times 10^{19}/cm^3$ or lower, preferably $5 \times 10^{18}/cm^3$ or lower.

Note that the heat treatment for dehydration or dehydrogenation may be performed at any timing in the process of manufacturing the transistor 422 as long as the heat treatment is performed after the formation of the oxide semiconductor layer 413. In the case where an aluminum oxide film is used as the gate insulating layer 402 or the insulating layer 406, the heat treatment is preferably performed before the formation of the aluminum oxide film. Further, the heat treatment for the dehydration or dehydrogenation may be performed plural times, and may also serve as another heat treatment.

Note that in the case where a base insulating layer containing oxygen is provided as the base insulating layer 436, the heat treatment for the dehydration or dehydrogenation is preferably performed before the oxide semiconductor layer 413 is processed into an island shape because oxygen contained in the base insulating layer 436 can be prevented from being released by the heat treatment.

In the heat treatment, it is preferable that water, hydrogen, and the like be not contained in nitrogen or a rare gas such as helium, neon, or argon. The purity of nitrogen or a rare gas such as helium, neon, or argon which is introduced into a heat treatment apparatus is preferably 6N (99.9999%) or higher, more preferably 7N (99.99999%) or higher (that is, the impurity concentration is preferably 1 ppm or lower, more preferably 0.1 ppm or lower).

In addition, after the oxide semiconductor layer 413 is heated by the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew point meter of a cavity ring down laser spectroscopy (CRDS) system) may be introduced into the same furnace while the heating temperature is maintained or slow cooling is performed to lower the temperature from the heating temperature. It is preferable that water, hydrogen, or the like be not contained in the oxygen gas or the dinitrogen monoxide gas. The purity of the oxygen gas or the dinitrogen monoxide gas which is introduced into the heat treatment apparatus is preferably 6N or higher, more preferably 7N or higher (i.e., the impurity concentration in the oxygen gas or the dinitrogen monoxide gas is preferably 1 ppm or lower, more preferably 0.1 ppm or lower). The oxygen gas or the dinitrogen monoxide gas acts to supply oxygen that is a main component of the oxide semiconductor and that has been reduced by the step of removing an impurity for the dehydration or dehydrogenation, so that the oxide semiconductor layer 413 can have high purity and be an i-type (intrinsic) oxide semiconductor layer.

Further or alternatively, oxygen (which includes at least one of an oxygen radical, an oxygen atom, and an oxygen ion) may be introduced into the oxide semiconductor layer that has been subjected to the dehydration or dehydrogenation treatment in order to supply oxygen to the oxide semiconductor layer.

Introduction (supply) of oxygen into the dehydrated or dehydrogenated oxide semiconductor layer enables the oxide semiconductor layer to be highly purified and to be i-type (intrinsic). Variation in electric characteristics of a transistor having the highly-purified and i-type (intrinsic) oxide semiconductor layer is suppressed, and the transistor is electrically stable.

In the step of introducing oxygen into the oxide semiconductor layer, oxygen may be directly introduced into the oxide semiconductor layer or introduced into the oxide semiconductor layer 403 through another film such as the gate insulating layer 402 or the insulating layer 406 formed later. An ion implantation method, an ion doping method, a plasma immersion ion implantation method, or the like may be employed for the introduction of oxygen through another film, whereas plasma treatment or the like can be employed in addition to the above methods for the introduction of oxygen directly into the exposed oxide semiconductor layer 413.

The introduction of oxygen into the oxide semiconductor layer can be performed anytime after the formation of the oxide semiconductor layer. The step of introducing oxygen into the oxide semiconductor layer may be performed plural times.

Next, the island-shaped oxide semiconductor layer 403 is formed by processing the oxide semiconductor layer 413 by a photolithography process. Here, as the mask used for the processing for forming the island-shaped oxide semiconductor layer 403, a mask having a finer pattern which is formed by performing a slimming process on a mask formed by a photolithography method or the like is preferably used.

As the slimming process, an ashing process in which oxygen in a radical state (an oxygen radical) or the like is used can be employed, for example. An oxide semiconductor layer having a tapered end portion can be formed by etching the oxide semiconductor layer 413 while performing an ashing process on the mask. However, the slimming process is not limited to the ashing process as long as the mask formed by a photolithography method or the like can be processed into a finer pattern. Note that the channel length (L) of a transistor is determined by the mask formed by the slimming process. Therefore, it can be preferable to employ a process with high controllability as the slimming process.

As a result of the slimming process, the line width of the mask formed by a photolithography method or the like can be reduced to a length shorter than or equal to the resolution limit of a light exposure apparatus, preferably less than or equal to half of the resolution limit of a light exposure apparatus, more preferably less than or equal to one third of the resolution limit of the light exposure apparatus. For example, the line width can become greater than or equal to 30 nm and less than or equal to 2000 nm, preferably greater than or equal to 50 nm and less than or equal to 350 nm. This enables further miniaturization of the transistor.

Figure 3B:
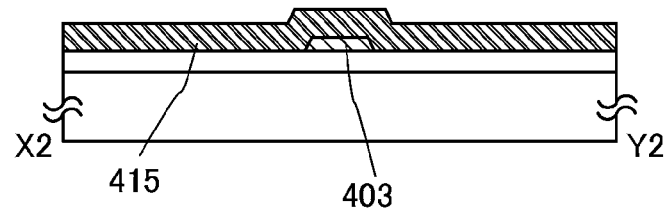
Figure 3C:
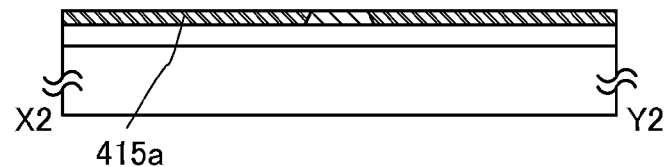

Next, a conductive film 415 which is to be a source electrode layer and a drain electrode layer (including a wiring formed using the same layer as the source electrode layer and the drain electrode layer) is formed over the island-shaped oxide semiconductor layer 403 (see FIG. 3B).

The conductive film 415 is formed using a material that can withstand heat treatment in a later step. For example, a metal film containing an element selected from Al, Cr, Cu, Ta, Ti, Mo, and W, or a metal nitride film containing any of the above elements as a component (a titanium nitride film, a molybdenum nitride film, or a tungsten nitride film) can be used. Further, a film of a high-melting-point metal such as Ti, Mo, or W or a metal nitride film thereof (a titanium nitride film, a molybdenum nitride film, or a tungsten nitride film) may be stacked over or/and below a metal film of Al, Cu, or the like. Alternatively, the conductive film 415 may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$, abbreviated to ITO), indium oxide-zinc oxide ($In_2O_3$—ZnO), or any of these metal oxide materials containing silicon oxide can be used.

Next, polishing (cutting or grinding) treatment is performed on the conductive film 415 to remove part of the conductive film 415, so that the oxide semiconductor layer 403 is exposed. A region of the conductive film 415 which overlaps with the oxide semiconductor layer 403 is removed by the polishing treatment, and a conductive film 415a having an opening in the region is formed (see FIG. 3C). For the polishing (cutting or grinding) treatment, chemical mechanical polishing (CMP) treatment can be favorably used. In this embodiment, the region of the conductive film 415 which overlaps with the oxide semiconductor layer 403 is removed by the CMP treatment.

Note that the CMP treatment may be performed only once or plural times. When the CMP treatment is performed plural times, first polishing is preferably performed with a high polishing rate followed by final polishing with a low polishing rate. By performing polishing at different polishing rates, the planarity of the surfaces of the source electrode layer 405a, the drain electrode layer 405b, and the oxide semiconductor layer 403 can be further improved.

Although the CMP treatment is used for removing the region of the conductive film 415 which overlaps with the oxide semiconductor layer 403 in this embodiment, another polishing (grinding or cutting) treatment may be used. Alternatively, the polishing treatment such as the CMP treatment may be combined with etching (dry etching or wet etching) treatment or plasma treatment. For example, after the CMP treatment, dry etching treatment or plasma treatment (reverse sputtering or the like) may be performed to improve the planarity of the surface to be processed. In the case where the polishing treatment is combined with etching treatment, plasma treatment, or the like, the order of the steps is not particularly limited, and may be set as appropriate depending on the material, thickness, and roughness of the surface of the conductive film 415.

In this embodiment, the conductive film 415a and the oxide semiconductor layer 403 are at almost the same level in height. Note that the shape of the conductive film 415a (or the source electrode layer 405a and the drain electrode layer 405b which are formed by processing the conductive film 415a) differs depending on the conditions of the polishing treatment for removing the conductive film 415. For example, the conductive film 415a may be recessed in the film thickness direction with respect to the surface of the oxide semiconductor layer 403.

Figure 3D:
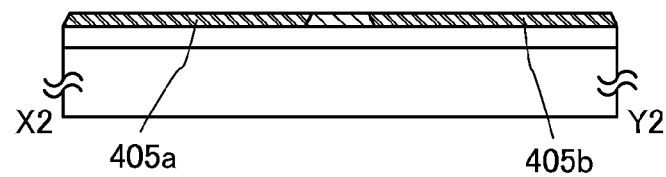

Then, the source electrode layer 405a and the drain electrode layer 405b (including a wiring formed using the same layer as the source electrode layer 405a and the drain electrode layer 405b) are formed by processing the conductive film 415a by a photolithography process (see FIG. 3D).

In the method described in this embodiment, the conductive film 415 is formed, the region of the conductive film 415 which overlaps with the oxide semiconductor layer 403 is removed by polishing treatment, and then selective etching is performed, so that the source electrode layer 405a and the drain electrode layer 405b are formed; however, one embodiment of the present invention is not limited to this method. The source electrode layer 405a and the drain electrode layer 405b may be formed by processing the conductive film 415 by selective etching and then removing the region of the conductive film 415 which overlaps with the oxide semiconductor layer 403 by polishing treatment. Note that in the case of performing the etching before the polishing treatment, the region of the conductive film 415 which overlaps with the oxide semiconductor layer 403 is not removed by the etching.

When the source electrode layer 405a and the drain electrode layer 405b are formed in the method for manufacturing the transistor described in this embodiment, etching treatment using a resist mask is not used in the step of removing the region of the conductive film 415 which overlaps with the oxide semiconductor layer 403; thus, precise processing can be accurately performed even in the case where the widths of the source electrode layer 405a and the drain electrode layer 405b in the channel length direction are miniaturized. Thus, in the manufacturing process of the semiconductor device, the transistor 422 having a minute structure and little variation in shapes and characteristics can be manufactured with a high yield.

Further, the removal of the region of the conductive film 415 which overlaps with the oxide semiconductor layer 403 enables the oxide semiconductor layer 403 to be in contact with the source electrode layer 405a or the drain electrode layer 405b on the side surface in the channel length direction. Since the oxide semiconductor layer 403 has a thickness as small as 3 nm to 30 nm, preferably 5 nm to 20 nm, the oxide semiconductor layer 403 can have a smaller contact area with the source electrode layer 405a or the drain electrode layer 405b by being in contact with the source electrode layer 405a or the drain electrode layer 405b on its side surface, which results in an increase in contact resistance at the contact interface. Accordingly, even if the channel length (L) of the transistor 422 is shortened, the electric field between the source electrode layer 405a and the drain electrode layer 405b can be relaxed, so that a short-channel effect such as a shift in threshold voltage can be suppressed.

Next, the gate insulating layer 402 is formed over the oxide semiconductor layer 403, the source electrode layer 405a, and the drain electrode layer 405b.

The gate insulating layer 402 can be formed to have a thickness greater than or equal to 1 nm and less than or equal to 20 nm by a sputtering method, an MBE method, a CVD method, a pulsed laser deposition method, an ALD method, or the like as appropriate. The gate insulating layer 402 may be formed using a sputtering apparatus which performs deposition with surfaces of a plurality of substrates set substantially perpendicular to a surface of a sputtering target.

The larger the thickness of the gate insulating layer 402 is, the more easily a short-channel effect occurs; thus, the threshold voltage tends to shift to the negative side. However, in the method for manufacturing the transistor of this embodiment, the upper surfaces of the source electrode layer 405a, the drain electrode layer 405b, and the oxide semiconductor layer 403 are planarized by the polishing treatment; thus, the gate insulating layer 402 with a small thickness can be formed with good coverage.

The gate insulating layer 402 can use silicon oxide, gallium oxide, aluminum oxide, silicon nitride, silicon oxynitride, aluminum oxynitride, silicon nitride oxide, or the like. It is preferable that the gate insulating layer 402 include oxygen in a portion which is in contact with the oxide semiconductor layer 403. In particular, the gate insulating layer 402 preferably contains, in the film (bulk), oxygen the proportion of which is higher than the stoichiometric proportion. For example, in the case where a silicon oxide film is used as the gate insulating layer 402, the composition formula is preferably $SiO_{2+\alpha}$ ($\alpha>0$). In this embodiment, a silicon oxide film of $SiO_{2+\alpha}$ ($\alpha>0$) is used as the gate insulating layer 402. By using the silicon oxide film as the gate insulating layer 402, oxygen can be supplied to the oxide semiconductor layer 403, leading to favorable characteristics. Further, the gate insulating layer 402 is preferably formed in consideration of the size of a transistor to be formed and the step coverage with the gate insulating layer 402.

The gate insulating layer 402 can be formed using a high-k material such as hafnium oxide, yttrium oxide, hafnium silicate ($HfSi_xO_y$ ($x>0$, $y>0$)), hafnium silicate to which nitrogen is added ($HfSiO_xN_y$ ($x>0$, $y>0$)), hafnium aluminate ($HfAl_xO_y$ ($x>0$, $y>0$)), or lanthanum oxide, whereby gate leakage current can be reduced. The gate insulating layer 402 may have either a single-layer structure or a stacked-layer structure.

Further, similarly to the base insulating layer 436, the gate insulating layer 402 preferably includes an oxygen-excess region because oxygen vacancies in the oxide semiconductor layer 403 can be filled with the excess oxygen contained in the gate insulating layer 402. In the case of having a stacked-layer structure, the gate insulating layer 402 preferably includes an oxygen-excess region at least in a layer in contact with the oxide semiconductor layer 403. In order to provide the oxygen-excess region in the gate insulating layer 402, for example, the gate insulating layer 402 may be formed in an oxygen atmosphere. Alternatively, the oxygen-excess region may be formed by introduction of oxygen (including at least one of an oxygen radical, an oxygen atom, and an oxygen ion) into the gate insulating layer 402 after its formation. Oxygen can be introduced by an ion implantation method, an ion doping method, a plasma immersion ion implantation method, plasma treatment, or the like.

Note that in the case where oxygen is introduced into the formed gate insulating layer 402, oxygen may be introduced into the oxide semiconductor layer 403 by the oxygen introduction treatment. Heat treatment is preferably performed after oxygen is introduced into the gate insulating layer 402. The heat treatment can be performed at a temperature, for example, higher than or equal to 300° C. and lower than or equal to 450° C. Note that the heat treatment can also serve as dehydration treatment or dehydrogenation treatment on the oxide semiconductor layer 403.

The introduction of oxygen into the gate insulating layer 402 can be performed anytime after the formation of the gate insulating layer 402. A plurality of oxygen introduction methods can be used in combination. For example, oxygen may be introduced by an ion implantation method and plasma treatment after the formation of the gate insulating layer 402 and heat treatment may be performed. Alternatively, it is possible to introduce oxygen by plasma treatment after the formation of the gate insulating layer 402, introduce oxygen again by an ion implantation method in a later step after formation of the insulating layer 406, and perform heat treatment; the order of plasma treatment and ion implantation treatment may be changed.

Figure 4A:
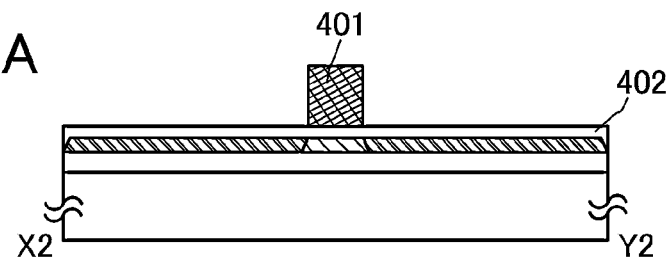
FIGS. 4A to 4C illustrate the example of the method for manufacturing the semiconductor device.

Next, the gate electrode layer 401 is formed over the island-shaped oxide semiconductor layer 403 with the gate insulating layer 402 provided therebetween (see FIG. 4A). The gate electrode layer 401 can be formed by a plasma CVD method, a sputtering method, or the like. Further, as a material of the gate electrode layer 401, a metal film containing an element selected from molybdenum, titanium, tantalum, tungsten, aluminum, copper, chromium, neodymium, and scandium; a metal nitride film containing any of the above elements as its component (a titanium nitride film, a molybdenum nitride film, or a tungsten nitride film); or the like can be used. Alternatively, a semiconductor film typified by a polycrystalline silicon film doped with an impurity element such as phosphorus, or a silicide film such as a nickel silicide film may be used as the gate electrode layer 401. The gate electrode layer 401 may have a single-layer structure or a stacked-layer structure.

The gate electrode layer 401 can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible that the gate electrode layer 401 has a stacked-layer structure of the above conductive material and the above metal material.

As one layer of the gate electrode layer 401 which is in contact with the gate insulating layer 402, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. Such a film has a work function higher than or equal to 5 eV (electron volt), preferably higher than or equal to 5.5 eV (electron volt), and the use of this film as the gate electrode layer enables the threshold voltage of a transistor to be positive. Accordingly, a so-called normally-off switching element can be obtained.

Note that the gate electrode layer 401 can be formed by processing a conductive film (not illustrated) provided over the gate insulating layer 402 with use of a mask. Here, as the mask used for the processing, a mask having a finer pattern which is formed by performing a slimming process on a mask formed by a photolithography method or the like is preferably used.

Figure 4B:
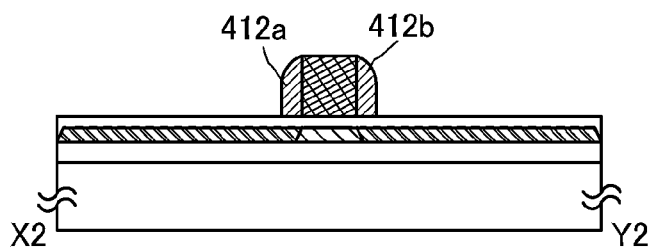

Next, a conductive film is formed over the gate electrode layer 401 and the gate insulating layer 402 and is etched, so that the sidewall layer 412a and the sidewall layer 412b are formed (see FIG. 4B).

The sidewall layer 412a and the sidewall layer 412b should have conductivity. For example, the sidewall layer 412a and the sidewall layer 412b can be formed by processing a metal film of tungsten, titanium, or the like or a silicon film containing an impurity element such as phosphorus or boron. Alternatively, the sidewall layer 412a and the sidewall layer 412b which have conductivity may be provided by forming a polycrystalline silicon film over the gate electrode layer 401 and the gate insulating layer 402, forming sidewall layers in contact with the gate electrode layer 401 by etching, introducing an impurity element such as phosphorus or boron into the sidewall layers by doping, and performing heat treatment.

Next, the insulating layer 406 and the insulating layer 407 are formed over the gate insulating layer 402, the gate electrode layer 401, the sidewall layer 412a, and the sidewall layer 412b. Note that in this embodiment, the insulating layer 406 and the insulating layer 407 are stacked over the gate insulating layer 402, the gate electrode layer 401, the sidewall layer 412a, and the sidewall layer 412b; however, an embodiment of the present invention is not limited thereto, and an insulating layer having a single-layer structure may be provided. Alternatively, three or more insulating layers may be stacked.

The insulating layer 406 or the insulating layer 407 can be formed by a plasma CVD method, a sputtering method, an evaporation method, or the like. In particular, the insulating layer 406 or the insulating layer 407 is preferably formed using, as appropriate, a method such as a sputtering method, in which an impurity such as water or hydrogen does not enter the insulating layer 406 or the insulating layer 407. As the insulating layer 406 or the insulating layer 407, an inorganic insulating film such as a silicon oxide film, a silicon oxynitride film, an aluminum oxynitride film, or a gallium oxide film, or the like can be typically used.

As the insulating layer 406 or the insulating layer 407, an aluminum oxide film, a hafnium oxide film, a magnesium oxide film, a zirconium oxide film, a lanthanum oxide film, a barium oxide film, or a metal nitride film (e.g., an aluminum nitride film) can be used.

Note that an aluminum oxide film is preferably provided as the insulating layer 406 or the insulating layer 407. The aluminum oxide film can be preferably applied because of a high shielding effect (blocking effect) which enables impermeability of both oxygen and impurities such as hydrogen and moisture; and in and after the manufacturing process, the aluminum oxide film functions as a protective film for preventing entry of impurities such as hydrogen and moisture, which cause a change in characteristics, into the oxide semiconductor layer 403 and release of oxygen, which is a main constituent material of the oxide semiconductor, from the oxide semiconductor layer 403.

In order to remove residual moisture from the deposition chamber of the insulating layer 406 or the insulating layer 407 in a manner similar to that of the formation of the oxide semiconductor layer 403, an entrapment vacuum pump (such as a cryopump) is preferably used. When the insulating layer 406 or the insulating layer 407 is deposited in the deposition chamber evacuated using a cryopump, the impurity concentration of the insulating layer 406 or the insulating layer 407 can be reduced. As an evacuation unit for removing moisture remaining in the deposition chamber of the insulating layer 406 or the insulating layer 407, a turbo molecular pump provided with a cold trap may be used.

In this embodiment, an aluminum oxide film is formed as the insulating layer 406 and a silicon oxide film is formed as the insulating layer 407. Note that when the aluminum oxide film has high density (film density higher than or equal to 3.2 g/cm$^3$, preferably higher than or equal to 3.6 g/cm$^3$), the transistor 422 can have stable electric characteristics. The film density can be measured by Rutherford backscattering spectrometry (RBS) or X-ray reflection (XRR).

In the case where an aluminum oxide film is formed as the insulating layer 406, heat treatment is preferably performed after the aluminum oxide film is formed. The aluminum oxide film has a function of preventing entry of water (including hydrogen) to the oxide semiconductor layer and a function of preventing release of oxygen from the oxide semiconductor layer. Thus, when the oxide semiconductor layer 403 and/or the insulating layer in contact therewith include(s) an oxygen-excess region, at least one region containing oxygen the proportion of which is higher than the stoichiometric proportion of the film can be provided in the film (bulk) or the interface between the insulating layer and the oxide semiconductor layer by performing heat treatment in a state where the aluminum oxide film is provided.

Figure 4C:
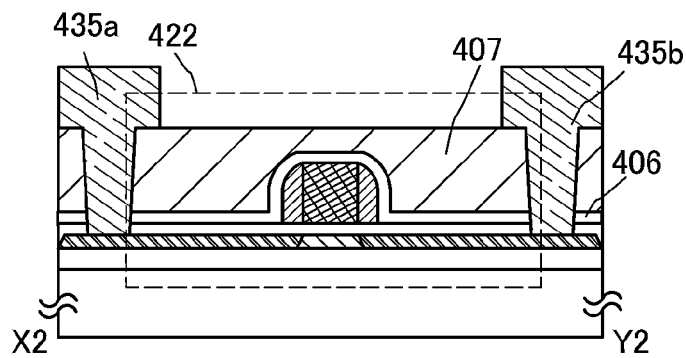

Next, openings reaching the source electrode layer 405a or the drain electrode layer 405b are formed in the insulating layer 407, the insulating layer 406, and the gate insulating layer 402, and the wiring layer 435a and the wiring layer 435b are formed in the openings (see FIG. 4C). With the use of the wiring layers 435a and 435b, the transistor is connected to another transistor or another element, which can lead to formation of a variety of circuits.

The wiring layer 435a and the wiring layer 435b can be formed using a material and a method similar to those of the gate electrode layer 401, the source electrode layer 405a, or the drain electrode layer 405b. For example, a metal film containing an element selected from Al, Cr, Cu, Ta, Ti, Mo, and W, or a metal nitride film containing any of the above elements as a component (a titanium nitride film, a molybdenum nitride film, or a tungsten nitride film) can be used. Further, a film of a high-melting-point metal such as Ti, Mo, or W or a metal nitride film thereof (a titanium nitride film, a molybdenum nitride film, or a tungsten nitride film) may be stacked over or/and below a metal film of Al, Cu, or the like. Alternatively, the conductive film used for the wiring layer 435a and the wiring layer 435b may be formed using a conductive metal oxide. As the conductive metal oxide, indium oxide ($In_2O_3$), tin oxide ($SnO_2$), zinc oxide (ZnO), indium oxide-tin oxide (abbreviated to ITO), indium oxide-zinc oxide ($In_2O_3$—ZnO), or any of these metal oxide materials in which silicon oxide is contained can be used.

For example, as the wiring layers 435a and 435b, a single layer of molybdenum film, a stack of a tantalum nitride film and a copper film, or a stack of a tantalum nitride film and a tungsten film can be used.

Through the above process, the transistor 422 of this embodiment is formed.

When the length of the island-shaped oxide semiconductor layer 403 in the channel length direction is longer than that of the gate electrode layer 401 in the channel length direction, the degree of freedom in alignment in the formation of the gate electrode layer 401 can be increased. In that case, an impurity region may be provided in the oxide semiconductor layer 403 to reduce the channel length of the transistor.

Figure 5A:
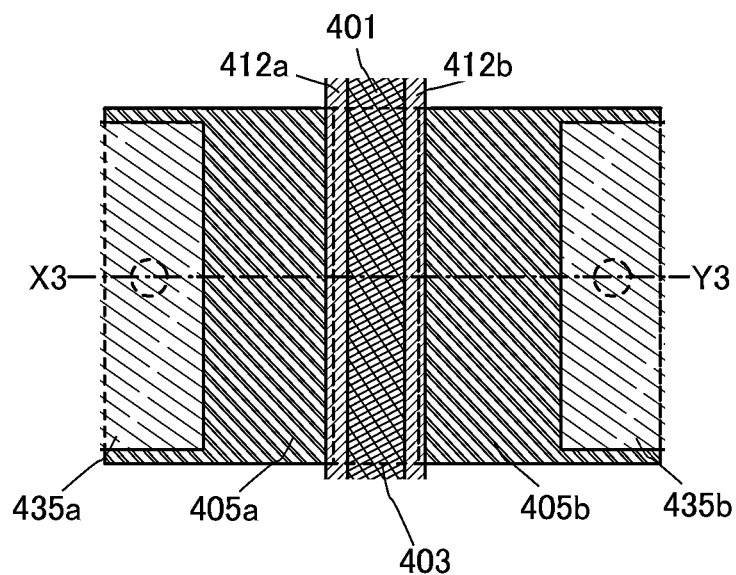
FIGS. 5A and 5B are a plan view and a cross-sectional view illustrating one embodiment of a semiconductor device.
Figure 5B:
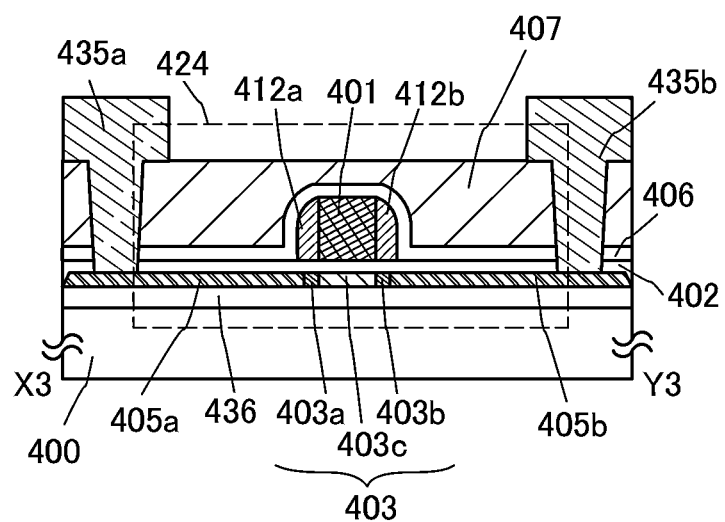
Figure 6A:
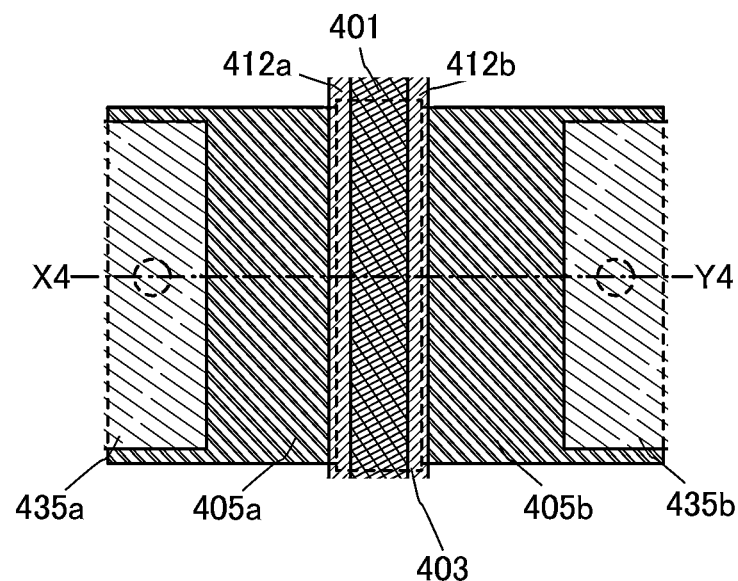
FIGS. 6A and 6B are a plan view and a cross-sectional view illustrating one embodiment of a semiconductor device.
Figure 6B:
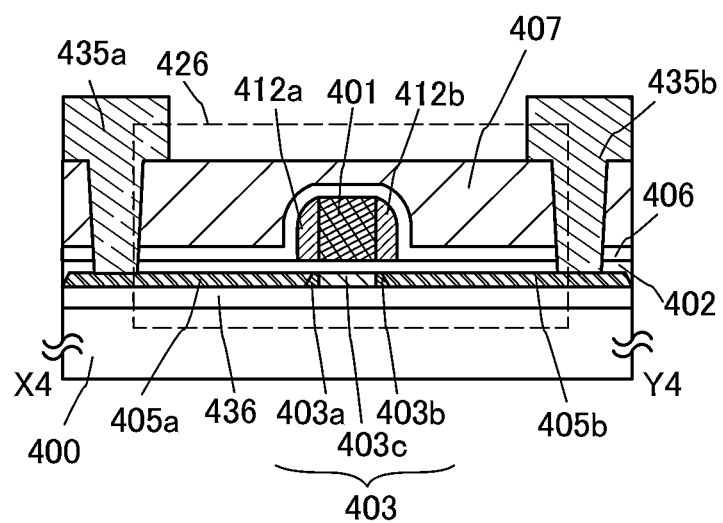

For example, a transistor 424 in FIGS. 5A and 5B and a transistor 426 in FIGS. 6A and 6B are examples in which impurity regions 403a and 403b are formed in a self-aligned manner by introduction of a dopant into the oxide semiconductor layer 403 with the use of the gate electrode layer 401 as a mask after the formation of the gate electrode layer 401.

The transistor 424 has a structure similar to that of the transistor 420, but is different from the transistor 420 in that the oxide semiconductor layer 403 included in the transistor 424 has a pair of impurity regions (impurity regions 403a and 403b) containing a dopant and a channel formation region 403c sandwiched between the pair of impurity regions. The transistor 426 in FIGS. 6A and 6B has a structure similar to that of the transistor 422, but is different from the transistor 422 in that the oxide semiconductor layer 403 included in the transistor 426 has the pair of impurity regions (impurity regions 403a and 403b) containing a dopant and the channel formation region 403c sandwiched between the pair of impurity regions. FIG. 5A is a plan view of the transistor 424, and FIG. 5B is a cross-sectional view taken along line X3-Y3 in FIG. 5A. FIG. 6A is a plan view of the transistor 426, and FIG. 6B is a cross-sectional view taken along line X4-Y4 in FIG. 6A.

The dopant is an impurity which changes the conductivity of the oxide semiconductor layer 403. One or more selected from the following can be used as the dopant: Group 15 elements (typical examples thereof are phosphorus (P), arsenic (As), and antimony (Sb)), boron (B), aluminum (Al), nitrogen (N), argon (Ar), helium (He), neon (Ne), indium (In), fluorine (F), chlorine (C1), titanium (Ti), and zinc (Zn). As the method for introducing the dopant, an ion implantation method, an ion doping method, a plasma immersion ion implantation method, or the like can be used.

With the oxide semiconductor layer including the pair of impurity regions between which the channel formation region 403c is sandwiched in the channel length direction, on-state characteristics (e.g., on-state current and field-effect mobility) of the transistors 424 and 426 are increased, which enables high-speed operation and quick response.

Note that in the case where an impurity region is not provided in the oxide semiconductor layer 403 as in the transistor 420 or the transistor 422 shown in FIGS. 1A and 1B or FIGS. 2A and 2B, an $L_{ov}$ region can be formed by increasing the width of the gate electrode layer 401 in the channel length direction instead of providing the sidewall layers 412a and 412b having conductivity. However, when the overlap length between the gate electrode layer 401 and the source electrode layer 405a or the drain electrode layer 405b (the width of the $L_{ov}$ region) is increased, parasitic capacitance generated in that region is increased. In this embodiment, the sidewall layers 412a and 412b which have conductivity are formed in a self-aligned manner on side surfaces of the gate electrode layer 401, so that a miniaturized $L_{ov}$ region can be formed with high precision. Thus, the $L_{ov}$ region can be formed with the parasitic capacitance prevented from being increased.

The semiconductor device described in this embodiment includes the oxide semiconductor layer 403 that is in contact with the source electrode layer 405a on one of the side surfaces in the channel length direction and in contact with the drain electrode layer 405b on the other of the side surfaces in the channel length direction. This structure enables the region where the oxide semiconductor layer 403 is in contact with the source electrode layer 405a or the drain electrode layer 405b to have high resistance, thus achieving relaxation of the electric field between the source electrode layer 405a and the drain electrode layer 405b. Consequently, a short-channel effect due to miniaturization of the transistor can be suppressed.

In the semiconductor device of this embodiment, the sidewall layer 412a and the sidewall layer 412b which have conductivity are provided on the side surfaces of the gate electrode layer 401 in the channel length direction. Thus, the sidewall layer 412a and the sidewall layer 412b which have conductivity overlap with the source electrode layer 405a and the drain electrode layer 405b, respectively, with the gate insulating layer 402 provided therebetween; therefore, the transistor substantially includes an $L_{ov}$ region, and a decrease in on-state current of the transistor can be suppressed.

As described above, according to an embodiment of the disclosed invention, a problem due to miniaturization can be resolved. As a result, the size of the transistor can be sufficiently reduced. When the size of the transistor is sufficiently reduced, the size of the semiconductor device is also reduced and thus the number of semiconductor devices manufactured from one substrate is increased. Accordingly, manufacturing costs of the semiconductor device can be reduced. Further, since the semiconductor device is downsized, the semiconductor device which is substantially the same in size with further increased function can be realized. Furthermore, effects of high-speed operation, low power consumption, and the like of a transistor can be obtained owing to a reduction in channel length. Thus, miniaturization of a transistor including an oxide semiconductor can be achieved according to an embodiment of the disclosed invention, and various effects accompanied with the miniaturization can be obtained.

The structures, methods, and the like described in this embodiment can be combined as appropriate with any of the structures, methods, and the like described in the other embodiments.

Embodiment 2

In this embodiment, an example of a semiconductor device which includes the transistor described in this specification, which can hold stored data even when not powered, and which has an unlimited number of write cycles is described with reference to drawings.

Figure 7A:
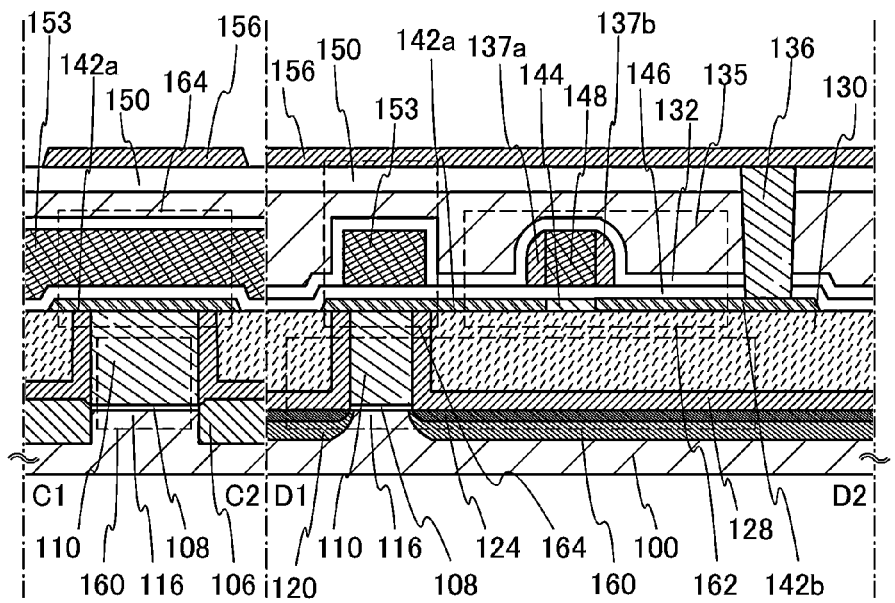
FIGS. 7A to 7C are a cross-sectional view, a plan view, and a circuit diagram illustrating one embodiment of a semiconductor device.
Figure 7B:
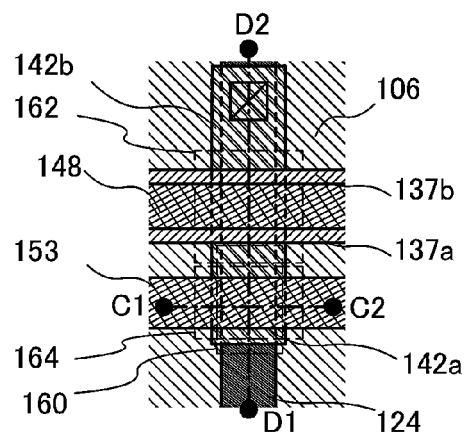
Figure 7C:
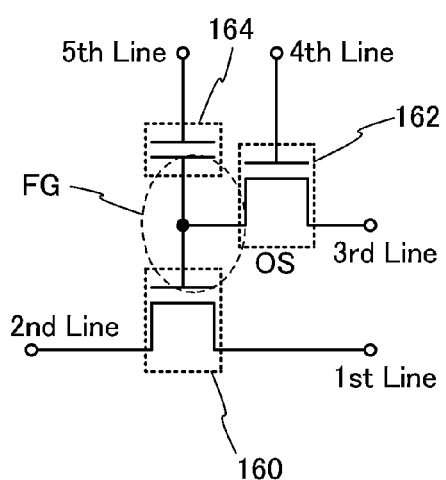

FIGS. 7A to 7C illustrate an example of a structure of a semiconductor device. FIGS. 7A to 7C illustrate a cross-sectional view, a plan view, and a circuit diagram, respectively, of the semiconductor device. Here, FIG. 7A corresponds to cross sections taken along line C1-C2 and line D1-D2 in FIG. 7B.

The semiconductor device illustrated in FIGS. 7A and 7B includes a transistor 160 including a first semiconductor material in a lower portion, and a transistor 162 including a second semiconductor material in an upper portion. Here, the structure of the transistor 420 described in Embodiment 1 is applied to the transistor 162.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, a transistor including an oxide semiconductor enables holding of charge for a long time owing to its characteristics.

Although all the transistors are n-channel transistors here, it is needless to say that p-channel transistors can be used. The specific structure of the semiconductor device, such as the material used for the semiconductor device and the structure of the semiconductor device, is not necessarily limited to those described here except for the use of the transistor described in Embodiment 1, which is formed using an oxide semiconductor, as the transistor 162 for holding data.

The transistor 160 in FIG. 7A includes a channel formation region 116 provided in a substrate 100 containing a semiconductor material (e.g., silicon), impurity regions 120 provided such that the channel formation region 116 is sandwiched therebetween, intermetallic compound regions 124 in contact with the impurity regions 120, a gate insulating layer 108 provided over the channel formation region 116, and a gate electrode layer 110 provided over the gate insulating layer 108. Note that a transistor whose source electrode layer and drain electrode layer are not illustrated in a drawing may be referred to as a transistor for the sake of convenience. Further, in such a case, in description of a connection of a transistor, a source region and a source electrode layer may be collectively referred to as a source electrode layer, and a drain region and a drain electrode layer may be collectively referred to as a drain electrode layer. That is, in this specification, the term "source electrode layer" may include a source region.

An element isolation insulating layer 106 is provided over the substrate 100 to surround the transistor 160. An insulating layer 128 and an insulating layer 130 are provided to cover the transistor 160. Note that in the transistor 160, a sidewall insulating layer may be formed on a side surface of the gate electrode layer 110 and the impurity regions 120 may include a region having a different impurity concentration.

The transistor 160 formed using a single crystal semiconductor substrate can operate at high speed. Thus, when the transistor is used as a reading transistor, data can be read at high speed. In this embodiment, two insulating films are formed to cover the transistor 160. Note that the number of insulating films may be one, or may be three or more. As treatment prior to formation of the transistor 162 and a capacitor 164, CMP treatment is performed on the insulating films formed over the transistor 160, whereby the insulating layer 128 and the insulating layer 130 which have been planarized are formed and, at the same time, an upper surface of the gate electrode layer 110 is exposed.

As each of the insulating layer 128 and the insulating layer 130, typically, it is possible to use an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film. The insulating layer 128 and the insulating layer 130 can be formed by a plasma CVD method, a sputtering method, or the like.

Alternatively, an organic material such as polyimide, an acrylic resin, or a benzocyclobutene-based resin can be used. Other than such organic materials, it is also possible to use a low-dielectric constant material (low-k material) or the like. In the case of using an organic material, a wet process such as a spin coating method or a printing method may be used to form the insulating layer 128 and the insulating layer 130.

Note that in this embodiment, a silicon nitride film is used as the insulating layer 128, and a silicon oxide film is used as the insulating layer 130.

Planarization treatment is preferably performed on a surface of the insulating layer 130 in the formation region of the oxide semiconductor layer 144. In this embodiment, the oxide semiconductor layer 144 is formed over the insulating layer 130 which is sufficiently planarized by polishing treatment such as CMP treatment (the average surface roughness of the surface of the insulating layer 130 is preferably less than or equal to 0.15 nm).

The transistor 162 illustrated in FIG. 7A includes an oxide semiconductor in the channel formation region. Here, the oxide semiconductor layer 144 included in the transistor 162 is preferably highly purified. By using a highly purified oxide semiconductor, the transistor 162 can have extremely favorable off-state characteristics.

Since the off-state current of the transistor 162 is low, stored data can be held for a long time owing to such a transistor. In other words, power consumption can be sufficiently reduced because a semiconductor storage device in which refresh operation is unnecessary or the frequency of refresh operation is extremely low can be provided.

The transistor 162 includes the oxide semiconductor layer 144 which is in contact with the electrode layer 142a or the electrode layer 142b on a side surface in a channel length direction. This structure enables a region where the oxide semiconductor layer 144 is in contact with the electrode layer 142a or the electrode layer 142b to have high resistance, thus achieving relaxation of an electric field between a source and a drain. Consequently, a short-channel effect due to miniaturization of the transistor can be suppressed.

The transistor 162 includes sidewall layers 137a and 137b having conductivity on side surfaces of a gate electrode layer 148 in the channel length direction, so that the sidewall layers 137a and 137b having conductivity overlap with the electrode layers 142a and 142b, respectively, with a gate insulating layer 146 provided therebetween, which enables the transistor 162 to substantially have $L_{ov}$ regions, leading to suppression of a decrease in on-state current of the transistor 162.

An insulating layer 132, an interlayer insulating film 135, and an insulating layer 150 each of which has a single-layer structure or a stacked-layer structure are provided over the transistor 162. In this embodiment, an aluminum oxide film is used as each of the insulating layer 132 and the insulating layer 150. When the aluminum oxide films have high density (film density of 3.2 g/cm$^3$ or more, preferably 3.6 g/cm$^3$ or more), the transistor 162 can have stable electric characteristics.

In addition, a conductive layer 153 is provided in a region overlapping with the electrode layer 142a of the transistor 162 with the gate insulating layer 146 provided therebetween, and the electrode layer 142a, the gate insulating layer 146, and the conductive layer 153 form the capacitor 164. That is, the electrode layer 142a of the transistor 162 functions as one electrode of the capacitor 164, and the conductive layer 153 functions as the other electrode of the capacitor 164. Note that the capacitor 164 may be omitted if a capacitor is not needed. Alternatively, the capacitor 164 may be separately provided above the transistor 162.

In this embodiment, the conductive layer 153 can be formed in the same manufacturing step as the gate electrode layer 148 of the transistor 162. Note that sidewall layers may be provided also on side surfaces of the conductive layer 153 in the step of forming the sidewall layers 137a and 137b on the side surfaces of the gate electrode layer 148.

A wiring 156 for connecting the transistor 162 to another transistor is provided over the insulating layer 150. The wiring 156 is electrically connected to the electrode layer 142b through an electrode layer 136 formed in an opening provided in the insulating layer 150, the interlayer insulating film 135, the insulating layer 132, the gate insulating layer 146, and the like.

In FIGS. 7A and 7B, the transistor 160 and the transistor 162 are provided so as to at least partly overlap with each other. The source region or the drain region of the transistor 160 is preferably provided so as to overlap with part of the oxide semiconductor layer 144. Further, the transistor 162 and the capacitor 164 are provided so as to overlap with at least part of the transistor 160. For example, the conductive layer 153 of the capacitor 164 is provided so as to at least partly overlap with the gate electrode layer 110 of the transistor 160. With such a planar layout, the area occupied by the semiconductor device can be reduced; thus, higher integration can be achieved.

Note that the electrical connection between the electrode layer 142b and the wiring 156 may be established by putting the wiring 156 in direct contact with the electrode layer 142b without providing the electrode layer 136. Alternatively, the electrical connection may be established through a plurality of electrode layers.

FIG. 7C illustrates an example of a circuit configuration corresponding to FIGS. 7A and 7B.

In FIG. 7C, a first wiring (1st Line) is electrically connected to a source electrode layer of the transistor 160. A second wiring (2nd Line) is electrically connected to a drain electrode layer of the transistor 160. A third wiring (3rd Line) is electrically connected to one of a source electrode layer and a drain electrode layer of the transistor 162, and a fourth wiring (4th Line) is electrically connected to a gate electrode layer of the transistor 162. A gate electrode layer of the transistor 160 and the other of the source electrode layer and the drain electrode layer of the transistor 162 are electrically connected to one electrode of the capacitor 164. A fifth wiring (5th Line) is electrically connected to the other electrode of the capacitor 164.

The semiconductor device in FIG. 7C utilizes a characteristic in which the potential of the gate electrode layer of the transistor 160 can be held, and can thus write, hold, and read data as follows.

Writing and holding of data are described. First, the potential of the fourth wiring is set to a potential at which the transistor 162 is turned on, so that the transistor 162 is turned on. Accordingly, the potential of the third wiring is applied to the gate electrode layer of the transistor 160 and to the capacitor 164. That is, predetermined charge is supplied to the gate electrode layer of the transistor 160 (writing). Here, one of two kinds of charge providing different potentials (hereinafter referred to as a low-level charge and a high-level charge) is given. After that, the potential of the fourth wiring is set to a potential at which the transistor 162 is turned off, so that the transistor 162 is turned off. Thus, the charge given to the gate electrode layer of the transistor 160 is held (holding).

Since the off-state current of the transistor 162 is extremely low, the charge of the gate electrode layer of the transistor 160 is held for a long time.

Next, reading of data is described. By supplying an appropriate potential (reading potential) to the fifth wiring while a predetermined potential (constant potential) is supplied to the first wiring, the potential of the second wiring varies depending on the amount of charge held in the gate electrode layer of the transistor 160. This is because in general, when the transistor 160 is an n-channel transistor, an apparent threshold voltage $V_{th\_H}$ in the case where a high-level charge is given to the gate electrode layer of the transistor 160 is lower than an apparent threshold voltage $V_{th\_L}$ in the case where a low-level charge is given to the gate electrode layer of the transistor 160. Here, an apparent threshold voltage refers to the potential of the fifth wiring, which is needed to turn on the transistor 160. Thus, the potential of the fifth wiring is set to a potential $V_0$ which is between $V_{th\_H}$ and $V_{th\_L}$, whereby charge given to the gate electrode layer of the transistor 160 can be determined. For example, in the case where a high-level charge is given in writing, when the potential of the fifth wiring is set to $V_0$ ($>V_{th\_H}$), the transistor 160 is turned on. In the case where a low-level charge is given in writing, even when the potential of the fifth wiring is set to $V_0$ ($<V_{th\_L}$), the transistor 160 remains in an off state. Therefore, the data held can be read by the potential of the second wiring.

Note that in the case where memory cells are arrayed, only data of desired memory cells need to be read. In the case where such reading is not performed, a potential at which the transistor 160 is turned off regardless of the state of the gate electrode layer of the transistor 160, that is, a potential lower than $V_{th\_H}$ may be given to the fifth wiring. Alternatively, a potential at which the transistor 160 is turned on regardless of the state of the gate electrode layer, that is, a potential higher than $V_{th\_L}$ may be given to the fifth wiring.

When a transistor having a channel formation region formed using an oxide semiconductor and having extremely low off-state current is applied to the semiconductor device in this embodiment, the semiconductor device can hold stored data for an extremely long period. In other words, power consumption can be sufficiently reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating layer does not occur at all. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily achieved.

As described above, a miniaturized and highly-integrated semiconductor device having favorable electric characteristics and a method for manufacturing the semiconductor device can be provided.

The structures, methods, and the like described in this embodiment can be combined as appropriate with any of the structures, methods, and the like described in the other embodiments.

Embodiment 3

In this embodiment, a semiconductor device which includes the transistor described in Embodiment 1, which can hold stored data even when not powered, which has an unlimited number of write cycles, and which has a structure different from the structure described in Embodiment 2 is described with reference to FIGS. 8A and 8B and FIGS. 9A and 9B.

Figure 8A:
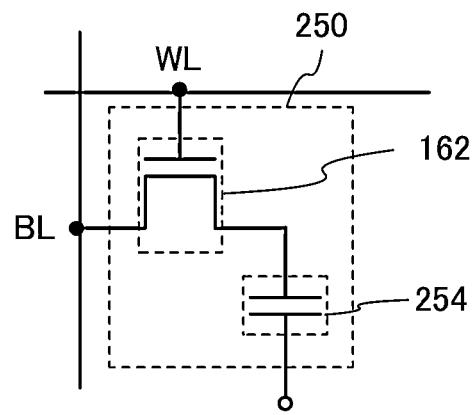
FIGS. 8A and 8B are a circuit diagram and a perspective view illustrating one embodiment of a semiconductor device.
Figure 8B:
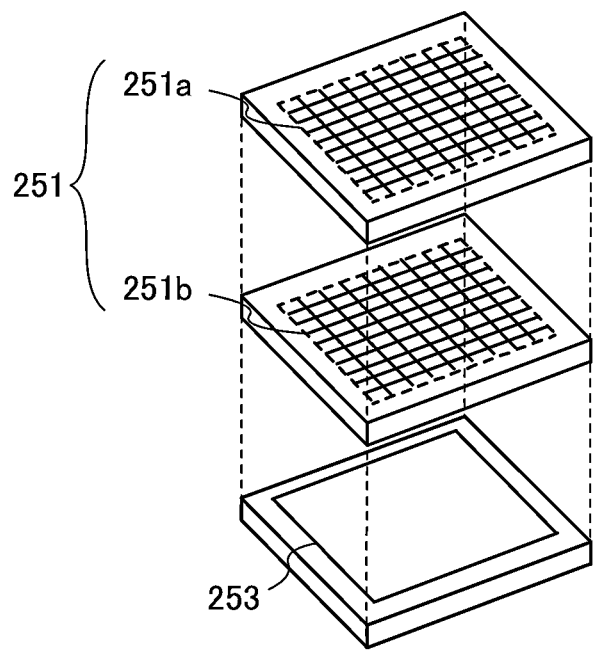

FIG. 8A illustrates an example of a circuit configuration of a semiconductor device, and FIG. 8B is a conceptual diagram illustrating an example of a semiconductor device. First, the semiconductor device illustrated in FIG. 8A is described, and then, the semiconductor device illustrated in FIG. 8B is described.

In the semiconductor device illustrated in FIG. 8A, a bit line BL is electrically connected to the source electrode layer or the drain electrode layer of the transistor 162, a word line WL is electrically connected to the gate electrode layer of the transistor 162, and the source electrode layer or the drain electrode layer of the transistor 162 is electrically connected to a first terminal of a capacitor 254.

Next, writing and holding of data in the semiconductor device (a memory cell 250) illustrated in FIG. 8A are described.

First, the potential of the word line WL is set to a potential at which the transistor 162 is turned on, so that the transistor 162 is turned on. Accordingly, the potential of the bit line BL is supplied to the first terminal of the capacitor 254 (writing). After that, the potential of the word line WL is set to a potential at which the transistor 162 is turned off, so that the transistor 162 is turned off. Thus, the potential of the first terminal of the capacitor 254 is held (holding).

The transistor 162 including an oxide semiconductor has extremely low off-state current. For that reason, a potential of the first terminal of the capacitor 254 (or a charge accumulated in the capacitor 254) can be held for an extremely long period by turning off the transistor 162.

Next, reading of data is described. When the transistor 162 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is $(C_B \times V_{B0} + C \times V)/(C_B + C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0$ ($=(C_B \times V_{B0} + C \times V_0)/(C_B + C)$).

Then, by comparing the potential of the bit line BL with a predetermined potential, data can be read.

As described above, the semiconductor device illustrated in FIG. 8A can hold charge that is accumulated in the capacitor 254 for a long time because the off-state current of the transistor 162 is extremely low. In other words, power consumption can be sufficiently reduced because refresh operation becomes unnecessary or the frequency of refresh operation can be extremely low. Moreover, stored data can be held for a long period even when power is not supplied.

Next, the semiconductor device illustrated in FIG. 8B is described.

The semiconductor device illustrated in FIG. 8B includes memory cell arrays 251a and 251b including a plurality of memory cells 250 illustrated in FIG. 8A as memory circuits in an upper portion, and a peripheral circuit 253 in a lower portion which is necessary for operating a memory cell array 251 (the memory cell arrays 251a and 251b). Note that the peripheral circuit 253 is electrically connected to the memory cell array 251.

In the structure illustrated in FIG. 8B, the peripheral circuit 253 can be provided under the memory cell array 251 (the memory cell arrays 251a and 251b). Thus, the size of the semiconductor device can be decreased.

It is preferable that a semiconductor material of the transistor provided in the peripheral circuit 253 be different from that of the transistor 162. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, the transistor can favorably realize a variety of circuits (e.g., a logic circuit or a driver circuit) which need to operate at high speed.

Note that FIG. 8B illustrates, as an example, the semiconductor device in which two memory cell arrays (the memory cell arrays 251a and 251b) are stacked; however, the number of stacked memory cell arrays is not limited thereto. Three or more memory cell arrays may be stacked.

Next, a specific structure of the memory cell 250 illustrated in FIG. 8A is described with reference to FIGS. 9A and 9B.

Figure 9A:
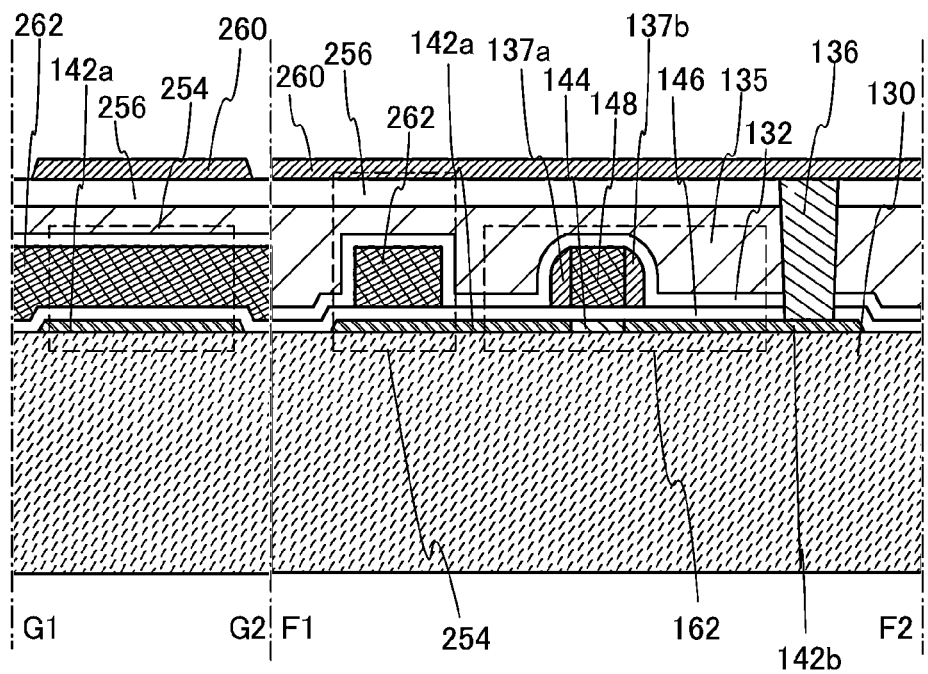
FIGS. 9A and 9B are a cross-sectional view and a plan view illustrating one embodiment of a semiconductor device.
Figure 9B:
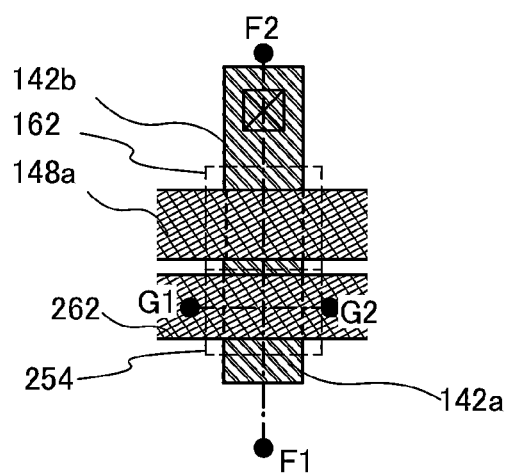

FIGS. 9A and 9B illustrate an example of a structure of the memory cell 250. FIG. 9A is a cross-sectional view of the memory cell 250, and FIG. 9B is a plan view of the memory cell 250. Here, FIG. 9A corresponds to cross sections taken along line F1-F2 and line G1-G2 in FIG. 9B.

The transistor 162 in FIGS. 9A and 9B can have a structure similar to any of the structures of the transistors described in Embodiment 1.

A conductive layer 262 is provided in a region overlapping with the electrode layer 142a of the transistor 162 with the gate insulating layer 146 provided therebetween, and the electrode layer 142a, the gate insulating layer 146, and the conductive layer 262 form the capacitor 254. That is, the electrode layer 142a of the transistor 162 functions as one electrode of the capacitor 254, and the conductive layer 262 functions as the other electrode of the capacitor 254.

The insulating layer 132, the interlayer insulating film 135, and an insulating layer 256 each having a single-layer structure or a stacked-layer structure are provided over the transistor 162 and the capacitor 254. Further, a wiring 260 for connecting the memory cell 250 to an adjacent memory cell 250 is provided over the insulating layer 256. The wiring 260 is electrically connected to the electrode layer 142b of the transistor 162 through an opening provided in the insulating layer 256, the interlayer insulating film 135, the insulating layer 132, the gate insulating layer 146, and the like. The wiring 260 may be directly connected to the electrode layer 142b. Note that the wiring 260 corresponds to the bit line BL in the circuit diagram of FIG. 8A.

In FIGS. 9A and 9B, the electrode layer 142b of the transistor 162 can also function as a source electrode layer of a transistor included in an adjacent memory cell. With such a planar layout, the area occupied by the semiconductor device can be reduced; thus, higher integration can be achieved.

As described above, the plurality of memory cells formed in multiple layers each include a transistor including an oxide semiconductor. Since the off-state current of the transistor including an oxide semiconductor is low, stored data can be held for a long period owing to such a transistor. In other words, power consumption can be sufficiently reduced because refresh operation becomes unnecessary or the frequency of refresh operation can be extremely low.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently low). In addition, with a structure where the peripheral circuit and the memory circuit are stacked, the degree of integration of the semiconductor device can be increased.

As described above, a miniaturized and highly-integrated semiconductor device having favorable electric characteristics and a method for manufacturing the semiconductor device can be provided.

This embodiment can be implemented in appropriate combination with the structures described in the other embodiments.

Embodiment 4

In this embodiment, examples of application of the semiconductor device described in any of the above embodiments to portable devices such as mobile phones, smartphones, or e-book readers will be described with reference to FIGS. 10A and 10B, FIG. 11, FIG. 12, and FIG. 13.

In a portable device such as a mobile phone, a smartphone, or an e-book reader, an SRAM or a DRAM is used to store image data temporarily and the like. An SRAM or a DRAM is used because a flash memory, whose response is slow, is unsuitable to be used for image processing. On the other hand, an SRAM or a DRAM has the following characteristics when used for temporary storage of image data.

Figure 10A:
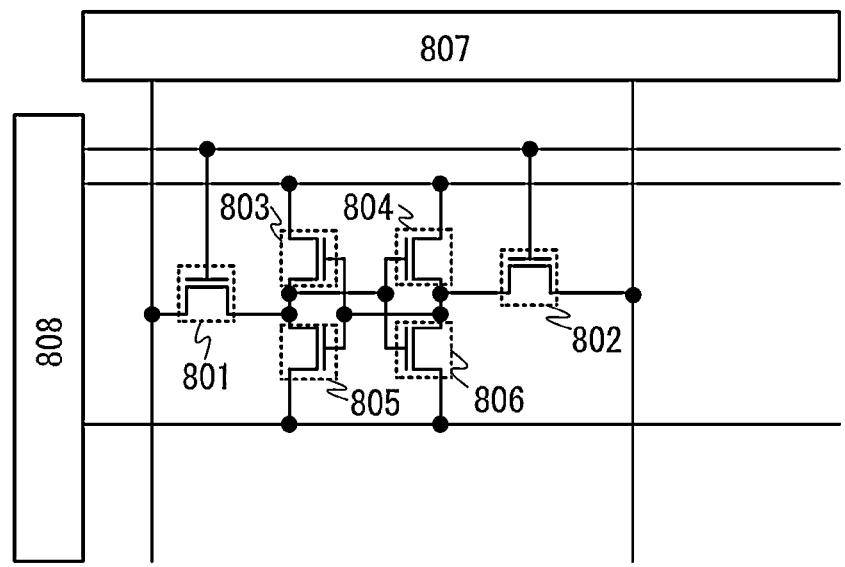
FIGS. 10A and 10B are circuit diagrams each illustrating one embodiment of a semiconductor device.

In an ordinary SRAM, as illustrated in FIG. 10A, one memory cell includes six transistors, that is, transistors 801 to 806, which are driven with an X decoder 807 and a Y decoder 808. A pair of the transistors 803 and 805 and a pair of the transistors 804 and 806 each serve as an inverter, and high-speed driving can be performed therewith. However, an SRAM has a disadvantage of large cell area because one memory cell includes six transistors. Provided that the minimum feature size of a design rule is F, the area of a memory cell in an SRAM is generally 100 $F^2$ to 150 $F^2$. Therefore, a price per bit of an SRAM is the highest among a variety of memory devices.

Figure 10B:
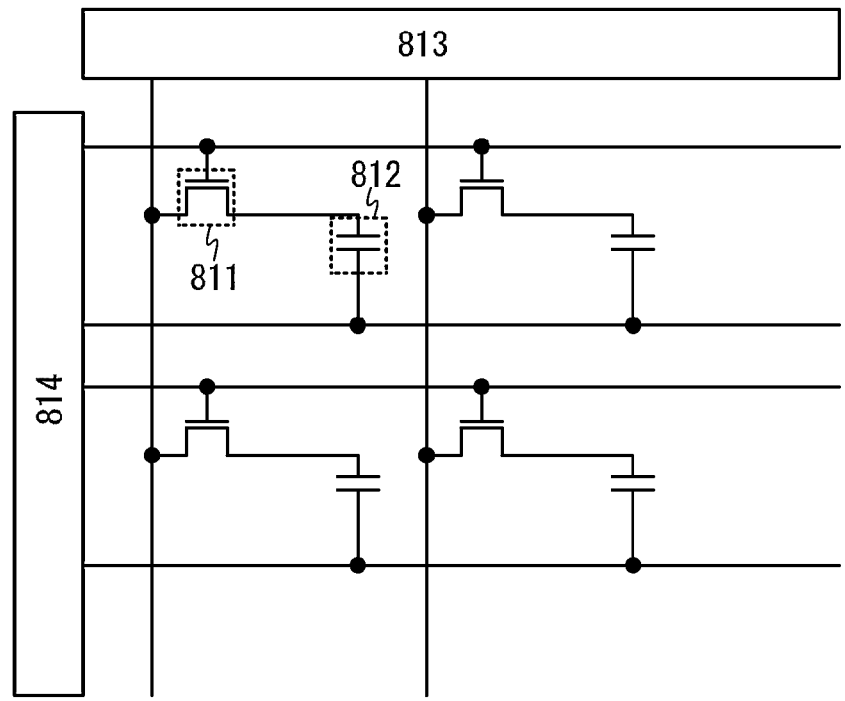

In a DRAM, as illustrated in FIG. 10B, a memory cell includes a transistor 811 and a storage capacitor 812, which are driven with an X decoder 813 and a Y decoder 814. One cell includes one transistor and one capacitor and thus the area of a memory cell is small. The area of a memory cell of a DRAM is generally less than or equal to 10 $F^2$. Note that in the case of a DRAM, a refresh operation is always necessary and power is consumed even when a rewriting operation is not performed.

However, the area of the memory cell of the semiconductor device described in any of the above embodiments is about 10 $F^2$ and frequent refreshing is not needed. Therefore, the area of the memory cell is reduced, and the power consumption can be reduced.

Figure 11:
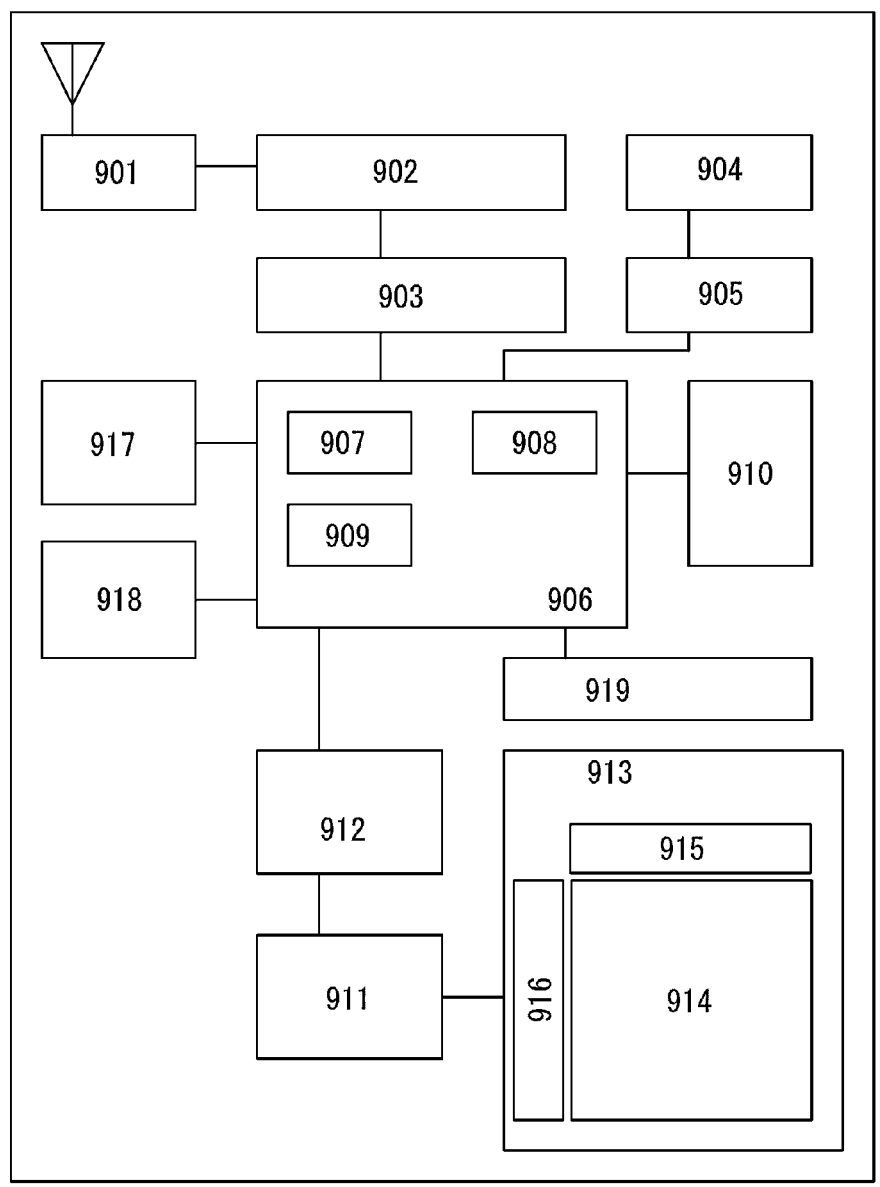
FIG. 11 is a block diagram illustrating one embodiment of a semiconductor device.

FIG. 11 is a block diagram of a portable device. The portable device illustrated in FIG. 11 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface 909 (IF 909). In general, the memory circuit 912 includes an SRAM or a DRAM; by employing the semiconductor device described in any of the above embodiments for the memory circuit 912, writing and reading of data can be performed at high speed, data can be held for a long time, and power consumption can be sufficiently reduced.

Figure 12:
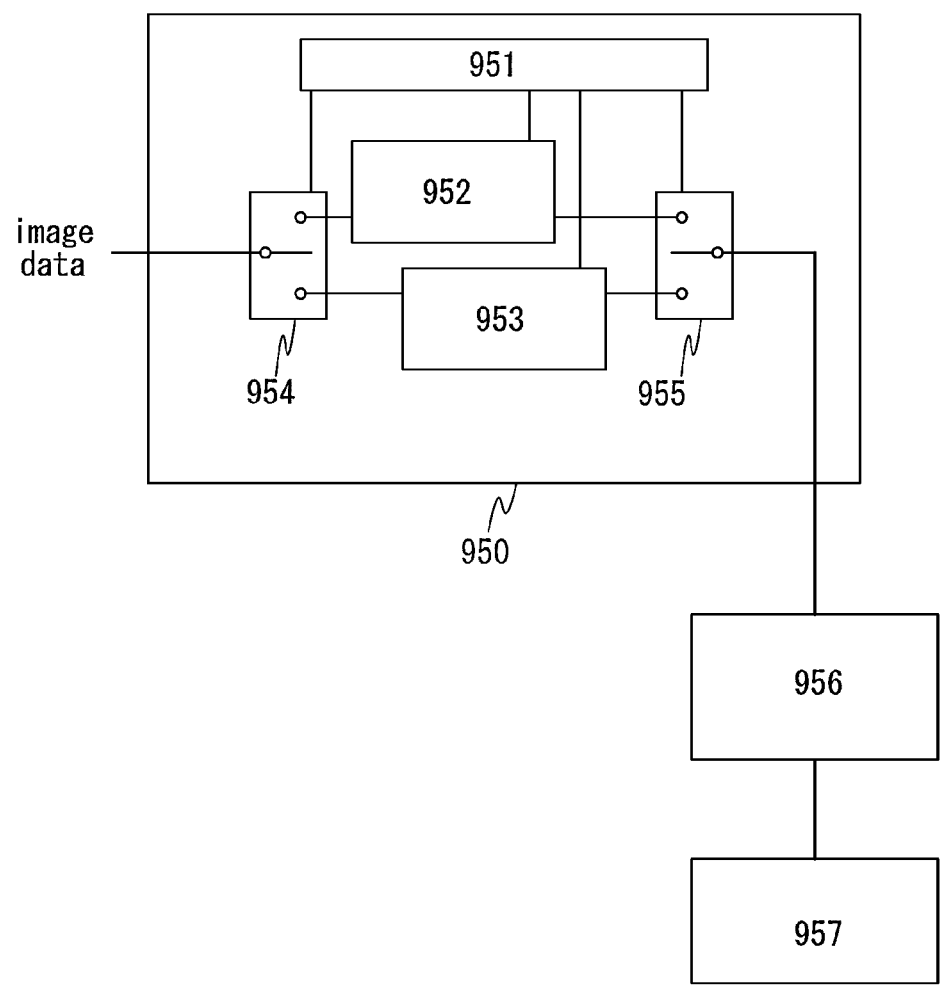
FIG. 12 is a block diagram illustrating one embodiment of a semiconductor device.

FIG. 12 illustrates an example of using the semiconductor device described in any of the above embodiments in a memory circuit 950 for a display. The memory circuit 950 illustrated in FIG. 12 includes a memory 952, a memory 953, a switch 954, a switch 955, and a memory controller 951. Further, the memory circuit is connected to a display controller 956 which reads and controls image data input through a signal line (input image data) and data stored in the memory 952 and the memory 953 (stored image data), and is also connected to a display 957 which displays an image based on a signal from the display controller 956.

First, image data (input image data A) is formed by an application processor (not shown). The input image data A is held in the memory 952 though the switch 954. The image data (stored image data A) stored in the memory 952 is transmitted to the display 957 through the switch 955 and the display controller 956 and is displayed on the display 957.

In the case where the input image data A is not changed, the stored image data A is read from the memory 952 through the switch 955 by the display controller 956 normally at a frequency of 30 Hz to 60 Hz.

Next, for example, when data displayed on the screen is rewritten by a user (that is, in the case where the input image data A is changed), new image data (input image data B) is formed by the application processor. The input image data B is held in the memory 953 through the switch 954. The stored image data A is read periodically from the memory 952 through the switch 955 even during that time. After the completion of storing the new image data (the stored image data B) in the memory 953, from the next frame for the display 957, the stored image data B starts to be read, transmitted to the display 957 through the switch 955 and the display controller 956, and displayed on the display 957. This reading operation is continued until another new image data is held in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and stored data can be held for a long time, and power consumption can be sufficiently reduced.

Figure 13:
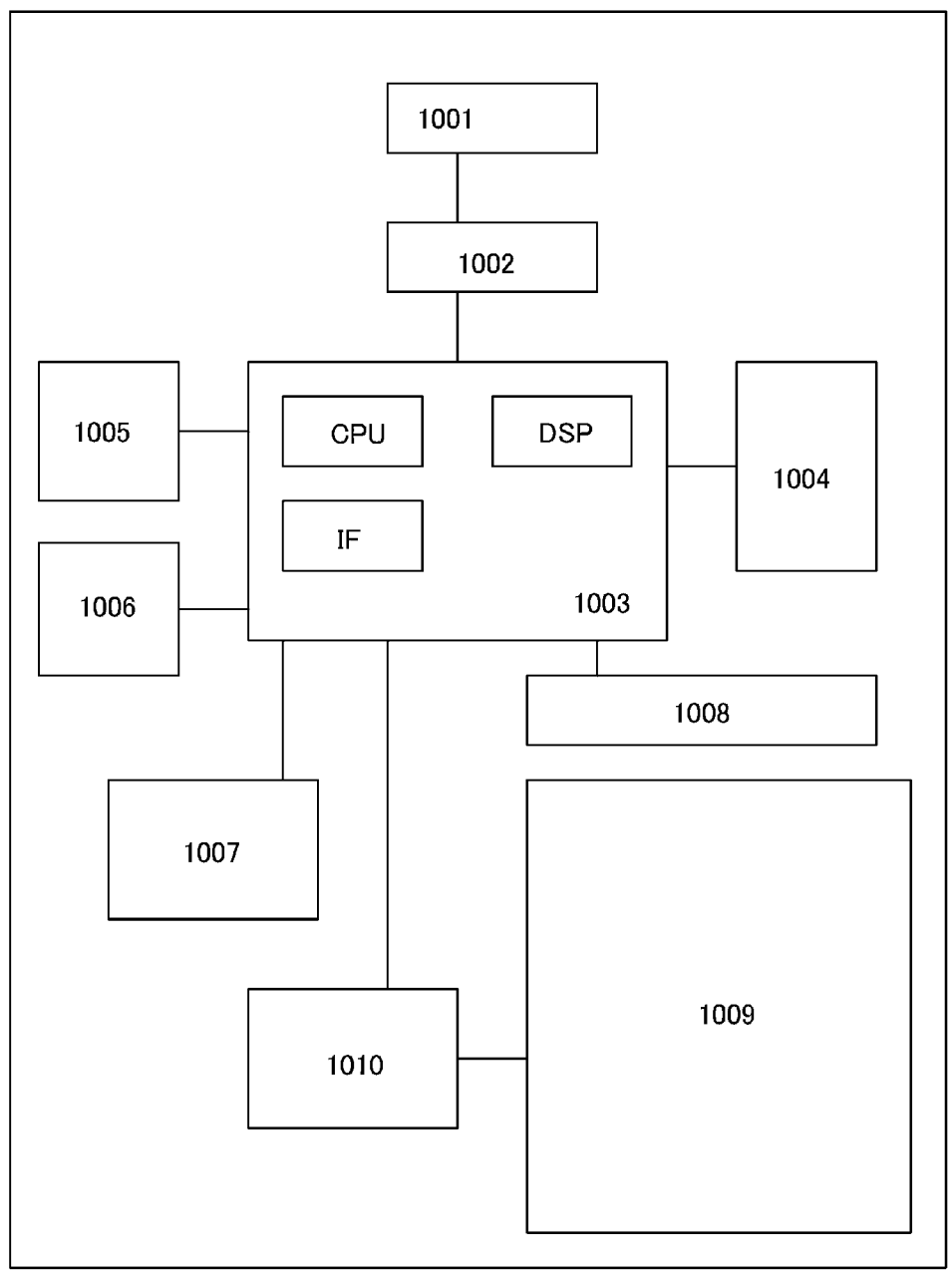
FIG. 13 is a block diagram illustrating one embodiment of a semiconductor device.

FIG. 13 is a block diagram of an e-book reader. The e-book reader in FIG. 13 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 13. The memory circuit 1007 has a function of temporarily holding the contents of a book. For example, a user may use a highlight function. In some cases, a user wants to mark a specific part while reading an e-book reader. Such a marking function is called a highlight function, by which characters are changed in color or type, underlined, or boldfaced, for example, so that a specific part is made to look distinct from the other part. The function makes it possible to store and hold data of a part specified by a user. In order to store the data for a long time, the data may be copied to the flash memory 1004. Even in such a case, by employing the semiconductor device described in any of the above embodiments, writing and reading of data can be performed at high speed, data can be held for a long time, and power consumption can be sufficiently reduced.

As described above, the semiconductor device in any of the above embodiments is mounted on each of the portable devices described in this embodiment. Therefore, it is possible to obtain a portable device which is capable of reading data at high speed, holding stored data for a long time, and reducing power consumption.

The structures, methods, and the like described in this embodiment can be combined as appropriate with any of the structures, methods, and the like described in the other embodiments.

This application is based on Japanese Patent Application serial no. 2011-223013 filed with Japan Patent Office on Oct. 7, 2011, the entire contents of which are hereby incorporated by reference.

What is claimed is:

1. A semiconductor device comprising:
   a substrate;
   a source electrode layer over the substrate;
   a drain electrode layer over the substrate;
   an oxide semiconductor layer over the substrate, and in contact with the source electrode layer on one of side surfaces in a channel length direction and in contact with the drain electrode layer on the other of the side surfaces in the channel length direction;
   a gate insulating layer in contact with an entire upper surface of the oxide semiconductor layer, at least a part of an upper surface of the source electrode layer, and at least a part of an upper surface of the drain electrode layer;
   a gate electrode layer over the oxide semiconductor layer with the gate insulating layer therebetween;
   a first sidewall layer having conductivity in contact with one of side surfaces of the gate electrode layer in the channel length direction; and
   a second sidewall layer having conductivity in contact with the other of the side surfaces of the gate electrode layer in the channel length direction,
   wherein at least part of the first sidewall layer is provided over the source electrode layer with the gate insulating layer therebetween,
   wherein at least part of the second sidewall layer is provided over the drain electrode layer with the gate insulating layer therebetween, and
   wherein the one of side surfaces of the oxide semiconductor layer in contact with the source electrode layer or the other of side surfaces of the oxide semiconductor layer in contact with the drain electrode layer includes a tapered shape with a taper angle of greater than or equal to 20° and less than or equal to 50°.

2. The semiconductor device according to claim 1, further comprising:
   an insulating layer provided over the first sidewall layer, the second sidewall layer, and the gate electrode layer;
   a first wiring layer electrically connected to the source electrode layer through a first opening provided in the insulating layer and the gate insulating layer; and a second wiring layer electrically connected to the drain electrode layer through a second opening provided in the insulating layer and the gate insulating layer.

3. A semiconductor device comprising:
a substrate;
a source electrode layer over the substrate;
a drain electrode layer over the substrate;
an oxide semiconductor layer including a first impurity region, a second impurity region, and a channel formation region sandwiched between the first impurity region and the second impurity region, the oxide semiconductor layer being over the substrate and in contact with the source electrode layer on a side surface of the first impurity region in a channel length direction and in contact with the drain electrode layer on a side surface of the second impurity region in the channel length direction;
a gate insulating layer in contact with an entire upper surface of the oxide semiconductor layer, at least a part of an upper surface of the source electrode layer, and at least a part of an upper surface of the drain electrode layer;
a gate electrode layer over the channel formation region with the gate insulating layer therebetween;
a first sidewall layer having conductivity in contact with one of side surfaces of the gate electrode layer in the channel length direction; and
a second sidewall layer having conductivity in contact with the other of the side surfaces of the gate electrode layer in the channel length direction,
wherein at least part of the first sidewall layer is provided over the source electrode layer with the gate insulating layer therebetween,
wherein at least part of the second sidewall layer is provided over the drain electrode layer with the gate insulating layer therebetween, and
wherein the side surface of the first impurity region in contact with the source electrode layer or the side surface of the second impurity region in contact with the drain electrode layer includes a tapered shape with a taper angle of greater than or equal to 20° and less than or equal to 50°.

4. The semiconductor device according to claim 3, further comprising:
an insulating layer provided over the first sidewall layer, the second sidewall layer, and the gate electrode layer;
a first wiring layer electrically connected to the source electrode layer through a first opening provided in the insulating layer and the gate insulating layer; and
a second wiring layer electrically connected to the drain electrode layer through a second opening provided in the insulating layer and the gate insulating layer.

5. The semiconductor device according to claim 1, wherein the upper surface of the oxide semiconductor layer is not in contact with the source electrode layer or the drain electrode layer.

6. The semiconductor device according to claim 1, wherein a lower surface of the oxide semiconductor layer is not in contact with the source electrode layer or the drain electrode layer.

7. The semiconductor device according to claim 1, wherein each of the first sidewall layer and the second sidewall layer contains one of tungsten, titanium, and silicon.

8. The semiconductor device according to claim 3, wherein the upper surface of the oxide semiconductor layer is not in contact with the source electrode layer or the drain electrode layer.

9. The semiconductor device according to claim 3, wherein a lower surface of the oxide semiconductor layer is not in contact with the source electrode layer or the drain electrode layer.

10. The semiconductor device according to claim 3, wherein each of the first sidewall layer and the second sidewall layer contains one of tungsten, titanium, and silicon.

11. The semiconductor device according to claim 1, wherein the source electrode layer and the drain electrode layer comprise one of a metal film and a metal nitride film, the metal film and the metal nitride film comprising an element selected from Al, Cr, Cu, Ta, Ti, Mo, and W.

12. The semiconductor device according to claim 1, wherein the source electrode layer and the drain electrode layer comprise one of indium oxide, tin oxide, and zinc oxide.

13. The semiconductor device according to claim 3, wherein the source electrode layer and the drain electrode layer comprise one of a metal film and a metal nitride film, the metal film and the metal nitride film comprising an element selected from Al, Cr, Cu, Ta, Ti, Mo, and W.

14. The semiconductor device according to claim 3, wherein the source electrode layer and the drain electrode layer comprise one of indium oxide, tin oxide, and zinc oxide.

* * * * *